United States Patent
Zhao et al.

(10) Patent No.: US 7,431,585 B2
(45) Date of Patent: Oct. 7, 2008

(54) APPARATUS AND METHOD FOR HEATING SUBSTRATES

(75) Inventors: Jun Zhao, Cupertino, CA (US); David Quach, San Jose, CA (US); Timothy Weidman, Sunnyvale, CA (US); Rick J. Roberts, Sunnyvale, CA (US); Farhad Moghadam, Saratoga, CA (US); Dan Maydan, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1008 days.

(21) Appl. No.: 10/278,615

(22) Filed: Oct. 22, 2002

(65) Prior Publication Data

US 2003/0138560 A1 Jul. 24, 2003

Related U.S. Application Data

(60) Provisional application No. 60/351,829, filed on Jan. 24, 2002.

(51) Int. Cl.
*F27D 3/00* (2006.01)

(52) U.S. Cl. .................. 432/241; 432/207; 432/247; 118/725; 219/390; 414/939

(58) Field of Classification Search .......... 432/241, 432/247, 253, 190, 207, 208, 258; 219/209, 219/390; 438/660, 663; 118/724, 725, 729; 414/217, 416.03, 416.08, 805, 811, 937, 414/939, 940
See application file for complete search history.

(56) References Cited

U.S. PATENT DOCUMENTS

| | | | |
|---|---|---|---|
| 2,897,772 A * | 8/1959 | Hunter | 99/352 |
| 5,201,653 A * | 4/1993 | Hasegawa et al. | 432/170 |
| 5,515,986 A | 5/1996 | Turlot et al. | |
| 5,772,386 A * | 6/1998 | Mages et al. | 414/411 |
| 5,897,311 A * | 4/1999 | Nishi | 432/239 |
| 5,915,957 A * | 6/1999 | Tanigawa | 432/5 |
| 6,164,961 A * | 12/2000 | Luscher et al. | 432/121 |
| 6,246,031 B1 | 6/2001 | Yoo | |
| 6,271,459 B1 | 8/2001 | Yoo | |
| 6,364,954 B2 * | 4/2002 | Umotoy et al. | 118/715 |
| 6,390,754 B2 * | 5/2002 | Yamaga et al. | 414/217 |
| 6,402,849 B2 * | 6/2002 | Kwag et al. | 118/715 |
| 6,448,537 B1 | 9/2002 | Nering | |
| 6,511,315 B2 * | 1/2003 | Hashimoto | 432/121 |

(Continued)

FOREIGN PATENT DOCUMENTS

WO  WO 00/36179  6/2000

OTHER PUBLICATIONS

Yoo et al., "Low-temperature annealing system for 300mm thermal processing," Solid State Technology, Jun. 2001, pp. 152-160.

*Primary Examiner*—Gregory A Wilson
(74) *Attorney, Agent, or Firm*—Townsend and Townsend and Crew LLP

(57) ABSTRACT

An apparatus for processing substrates is disclosed. In one embodiment, the apparatus includes a housing and a plurality of stacked cell structures in the housing. An actuator is adapted to move the plurality of stacked cell structures inside of the housing while substrates in the stacked cell structures are being heated.

33 Claims, 16 Drawing Sheets

U.S. PATENT DOCUMENTS

| | | |
|---|---|---|
| 6,544,035 B2 | 4/2003 | Tsuru |
| 6,572,371 B1 * | 6/2003 | Sion et al. .................. 432/247 |
| 6,825,447 B2 * | 11/2004 | Kim et al. .................. 219/390 |
| 2001/0016307 A1 * | 8/2001 | Ishii .......................... 432/239 |
| 2003/0194299 A1 * | 10/2003 | Yoo .......................... 414/271 |
| 2005/0188923 A1 | 9/2005 | Cook et al. |
| 2006/0245852 A1 | 11/2006 | Iwabuchi |

* cited by examiner

APPARATUS AND METHOD FOR HEATING SUBSTRATES

CROSS-REFERENCE TO RELATED APPLICATIONS

This non-provisional application claims the benefit of U.S. Provisional Patent Application No. 60/351,829, filed Jan. 24, 2002. This application is herein incorporated by reference herein in its entirety for all purposes.

BACKGROUND OF THE INVENTION

Semiconductor device features continue to decrease in size as the demand for faster and smaller electronic devices increases. As the spacing between conductive features (e.g., metal lines) decreases, the likelihood of capacitive coupling between the conductive features increases. To address this problem, low dielectric constant insulator layers (e.g., k<4.0) or "low k" dielectric layers are being increasingly used by the semiconductor industry to reduce capacitive coupling between adjacent metal lines. Porous dielectric layers are low k dielectric layers since they use air (which has a dielectric constant of approximately 1.0) as a partial dielectric medium.

Sol gel processes can be used to form porous dielectric layers. In a typical sol gel process, a sol gel layer is spin coated on a substrate using a sol gel solution. The sol gel solution may include a mixture of chemical compounds, water, and surfactant. After depositing the sol gel layer on the substrate, the substrate and the sol gel layer are heated to cure it. During the curing process, water and other components of the sol gel solution (e.g., surfactant) are removed from the sol gel layer. The chemical compounds form particles that bind together forming a porous dielectric layer.

After the porous dielectric layer is formed, the porous dielectric layer may be placed in a stripping chamber. In the stripping chamber, any remaining surfactant can be removed from the porous dielectric layer. Then, a thin capping layer may be formed on the porous dielectric layer.

The curing process that is used in the sol-gel process can be a "batch" process. In a batch curing process, many substrates with sol gel layers on them are heated simultaneously in the same manner and in the same curing chamber. After all of the sol gel layers on all of the substrates are cured, all of the substrates are removed from the curing chamber.

Although batch curing processes are useful, improvements could be made. For example, a batch curing process can take longer than prior or subsequent processes such spin coating and capping layer processes. As a result, the curing process can be considered the gate in the overall process flow and processing apparatuses that are used before and after the curing process may sit idle while waiting for the curing apparatus to cure the current batch of substrates.

It would be desirable to provide for a heating apparatus that can continuously process substrates. This would maximize the use of each apparatus in the overall process and would reduce the cycle times for the substrates being processed.

Embodiments of the invention address this and other problems.

SUMMARY OF THE INVENTION

Embodiments of the invention are directed to systems, apparatuses, methods, and cell structures for processing apparatuses.

One embodiment of the invention is directed to an apparatus for processing substrates, the apparatus comprising: a) a housing; b) an opening in the housing; c) a plurality of stacked cell structures within the housing, wherein each cell structure within the plurality of stacked cells is capable of containing a substrate; d) a heating assembly coupled to the plurality of stacked cell structures; and e) an actuator adapted to move the plurality of stacked cell structures inside of the housing.

Another embodiment of the invention is directed to an apparatus for heating substrates, the apparatus comprising: a) a first housing having a first opening; b) a second housing around the first housing and having a second opening, wherein the first opening and the second opening are aligned to form an entrance; c) a plurality of stacked cell structures within the housing, wherein each cell structure is capable of containing a substrate and defines a cell, and wherein each cell structure comprises a first gas permeable element, a second gas permeable plate facing the first permeable gas element, and a plurality of pins extending from the first permeable element; d) a linear actuator adapted to move the plurality of stacked cell structures in a vertical direction; e) a feed gas tube coupled to the plurality of stacked cell structures; f) an exhaust tube coupled to the plurality of stacked cell structures; g) a cold trap coupled to the exhaust tube, wherein the exhaust tube is between the plurality of stacked cell structures and the cold trap; h) a first heating assembly coupled to the plurality of stacked cell structures, wherein the first heating assembly is adapted to heat gas passing upstream and downstream of the plurality of cell structures; and i) a second heating assembly adapted to heat the first housing.

Another embodiment of the invention is directed to a cell structure for processing a substrate within the cell structure, the cell structure comprising: a first gas permeable element above the substrate; a lower gas permeable element under the substrate; and a plurality of pins extending from the first gas permeable element for supporting the substrate.

Another embodiment of the invention is directed to a method for processing substrates, the method comprising: a) inserting a first substrate within a first cell structure; b) heating the first substrate in the first cell structure; c) moving the plurality of stacked cell structures; d) inserting a second substrate within the second cell structure; and e) heating the second substrate in the second cell structure.

Another embodiment of the invention is directed to a method for processing a substrate, the method comprising: a) inserting a substrate in a cell structure comprising a first gas permeable element and a second gas permeable element facing the first gas permeable element; and b) heating the substrate while the substrate is spaced from the first gas permeable element and the second gas permeable element.

Another embodiment of the invention is directed to an apparatus for processing substrates, the apparatus comprising: a) a housing; b) an opening in the housing; c) a plurality of stacked cell structures within the housing, wherein each cell structure within the plurality of stacked cells is capable of containing a substrate; d) a heating assembly adapted to supply heat to the substrate; and e) an actuator adapted to move the plurality of stacked cell structures inside of the housing.

Another embodiment of the invention is directed to an apparatus for processing substrates, the apparatus comprising: a) a housing; b) a plurality of stacked cell structures within the housing, wherein each cell structure within the plurality of stacked cells comprises a first gas permeable element and a second gas permeable element facing the first gas permeable element; c) a heating assembly adapted to supply heat to the substrate; and d) an actuator adapted to move the plurality of stacked cell structures inside of the housing.

Another embodiment of the invention is directed to a method for processing substrates in an apparatus having a plurality of stacked cell structures, each cell structure being adapted to contain a substrate, the method comprising: a) inserting a first substrate and a first sol gel layer on the first substrate in a first cell structure; b) heating the first substrate and the first sol gel layer in the first cell structure to form a first mesoporous oxide layer from the first sol gel layer; c) moving the plurality of stacked cell structures; d) inserting a second substrate and a second sol gel layer on the second substrate within the second cell structure; and e) heating the second substrate and the second sol gel layer in the second cell structure to form a second mesoporous oxide layer from the second sol gel layer.

Other embodiments of the invention are directed to systems employing the heating apparatus embodiments. In some embodiments of the invention, the systems may be in the form of cluster tools.

These and other embodiments of the invention are described in greater detail below.

BRIEF DESCRIPTION OF THE DRAWINGS

Other embodiments are described in the Detailed Description below. In the Detailed Description, like reference numerals in the figures designate like elements.

DETAILED DESCRIPTION

Figure 1A:
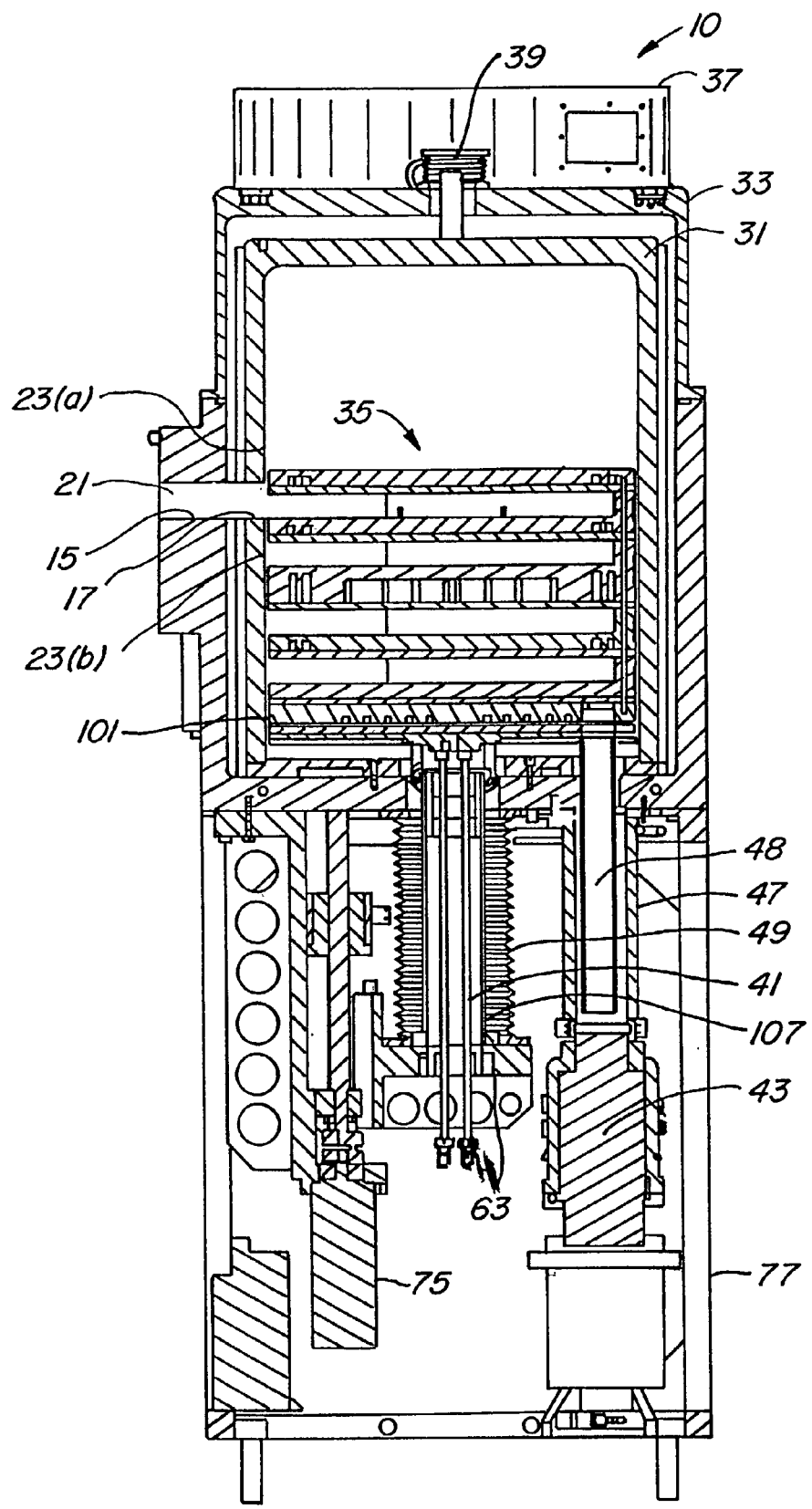
FIG. 1(a) shows a cross-sectional view of an apparatus according to an embodiment of the invention.

Many of the embodiments of the invention that are described below are described with reference to curing processes, porous silicon oxide dielectric layers, and sol gel processes. However, it is understood that the discussions relating to these embodiments are for illustrative purposes and that embodiments of the invention are not limited thereto. For example, the systems, apparatuses, and cell structures according to embodiments of the invention can be used in processes other than curing processes. For instance, embodiments of the invention could be used in thermal annealing and/or degas processes instead of curing processes. Moreover, dielectric layers other than porous silicon oxide layers may be formed using embodiments of the invention. For example, aluminum oxide layers could be formed using embodiments of the invention.

I. Heating Apparatus

One embodiment of the invention is directed to an apparatus for processing substrates such as semiconductor wafers (e.g., silicon wafers). The apparatus comprises a housing and an opening in the housing. A plurality of stacked cell structures is in the housing. Each cell structure within the plurality of stacked cells defines a cell and is capable of containing one or more substrates. A heating assembly is coupled to the plurality of stacked cell structures. The heating assembly can heat gas passing to the plurality of stacked cell structures and gas passing downstream of the plurality of stacked cell structures. In other embodiments, the heater may be external to the housing. Heat could be supplied to substrates in the cell structures through the housing.

During processing, an actuator such as a linear actuator moves the plurality of stacked cell structures up and down inside of the housing. Before a substrate is inserted into or removed from the interior of a cell structure, the interior of the cell structure can be aligned with the opening in the housing. Once the interior of the cell structure is aligned with the interior of the cell structure, a substrate can be inserted into the aligned cell structure or removed from the aligned cell structure through the opening. While the substrate is being inserted into or removed from the cell structure, other substrates in other cell structures are being heated in the heating apparatus. Substrates can thus be continuously processed using embodiments of the invention.

The interior of the heating apparatus may be maintained at any suitable temperature. For example, in an exemplary curing process, the internal temperature of the heating apparatus may be maintained above 50° C. (e.g., between about 300° C. and about 500° C.). In some embodiments, the interiors of all of the cell structures in the plurality of cell structures may be at about the same temperature during processing.

Substrates may be processed for any suitable amount of time in embodiments of the invention. For example, in a typical curing process, each substrate can be in the heating apparatus for about one minutes to about ten minutes. The particular curing temperature and time may depend on the particular curable material being cured (if a curing process is being performed) and the particular process being performed.

The interior of the heating apparatus may also be maintained at any suitable pressure. The pressure inside of the heating apparatus may vary depending upon the particular process being performed by the heating apparatus. For example, in some embodiments, the internal pressure of the heating apparatus may be between about 10 Torr and about 760 Torr. Pressures lower than about 10 Torr may also be used in embodiments of the invention.

Embodiments of the invention have a number of advantages. For example, in embodiments of the invention, unprocessed substrates can be continuously inserted into the heating apparatus and heated in the heating apparatus. Also, processed substrates can be continuously removed from the heating apparatus. Consequently, other processing apparatuses that are used prior to and after the heating apparatus can also be used continuously. In embodiments of the invention, substrates and processing apparatuses need not sit idle while waiting for a heating process to be performed by the heating apparatus. Also, embodiments of the invention have high processing capacity while having a small footprint. For example, the cell structures according to embodiments of the invention can be stacked. Stacking cell structures increases the processing capacity of the heating apparatus and also reduces its footprint (as compared to a heating apparatus without stacked cell structures). A heating apparatus with a small footprint is especially desirable in facilities where space is limited (e.g., in a cleanroom).

A cross-sectional view of a heating apparatus 10 according to an embodiment of the invention is shown in FIG. 1(a). The heating apparatus 10 includes a plurality of cell structures 35. A first housing 31 houses the plurality of cell structures 35 and may be cooperatively structured with the plurality of cell structures 35. A second housing 33 is disposed around the first housing 31 and is supported by a frame 77. The first and second housings 31, 33 and the frame 77 can be made of any suitable material including metals such as stainless steel. A top cover 37 can be disposed on top of the second housing 33.

A coupling element 39 including a flexible bellows may be used to mechanically couple the first housing 31 to the second housing 33. As will be explained in further detail below, the first housing 31 can be heated using one or more heating assemblies. Heating and cooling the first housing 31 causes it to expand and contract relative to other parts in the heating apparatus 10. The flexible bellows in the coupling element 39 allows the first housing 31 to freely expand and contract in the second housing 33 while stabilizing the position of the first housing 31 within the heating apparatus 10.

Aligned openings 15, 17 in the first and second housings 31, 33 together provide an entrance 21 to the interior of the heating apparatus 10. Substrates (not shown) such as semiconductor wafers may be inserted into or removed from individual cell structures in the plurality of cell structures 35 through the entrance 21. For example, a robot arm of a robot (not shown) may insert a substrate (not shown) through the entrance 21 and into the interior of the topmost cell structure in the plurality of cell structures 35 after the topmost cell structure is aligned with the entrance 21.

A first heating assembly 101 is under the plurality of cell structures 35 and may have lateral dimensions similar to the lateral dimensions of the plurality of cell structures 35. The first heating assembly 101 can include one or more distinct components such as a heating element. In embodiments of the invention, the heating element may be a resistive heating element or a fluidic heating element. In addition, one or more gas passages for housing exhaust gas streams and feed gas streams may be present in the first heating assembly 101. Additional details about the first heating assembly 101 and suitable components making up the first heating assembly 101 are provided below.

Feed gas tubes 41 are coupled to both the first heating assembly 101 and the plurality of cell structures 35. The illustrated feed gas tubes have two sets of opposing ends. One set of ends is proximate the first heating assembly 101. The other set of ends is distal to the first heating assembly 101 and can be coupled to flexible lines (not shown). The flexible lines may be, in turn, coupled to a feed gas source (not shown). A rigid tube 107 and a flexible bellows 49 surround the feed gas tubes 41. The flexible bellows 49 can flex in response to the vertical movement caused by a linear actuator 75. Electrical wires (not shown) can pass through the rigid tube 107 and may be coupled to the heating element in the first heating assembly 101.

A linear actuator 75 may be used to move the plurality of cell structures 35 and the first heating assembly 101 up and down within the first housing 31 and the second housing 33. To accommodate the movement of the plurality of cell structures 35, the space defined by the first housing 31 can be greater than about twice the volume of the plurality of cell structures 35. Because the plurality of cell structures 35 can be moved, each individual cell structure in the plurality of cell structures 35 can be aligned with the entrance 21 (as well as the openings 15, 17) of the heating apparatus 10. A substrate can be inserted into each aligned cell structure or removed from each aligned cell structure (e.g., automatically with a robot arm or manually) through the entrance 21.

In addition to the first heating assembly 101, various other heating assemblies can be present in the heating apparatus 10. For example, a second heating assembly (not shown) may be coupled to the top side of the first housing 31. Alternatively or additionally, a third heating assembly and a fourth heating assembly can be respectively included in an upper entrance portion 23(a) in the first housing 31 and a lower entrance portion 23(b) in the second housing 33. For example, heating assemblies comprising resistive heating elements may be embedded in the upper and lower entrance portions 23(a), 23(b) in the first housing. In some embodiments, the second, third, and fourth heating assemblies can be independently controllable from each other and from the first heating assembly 101. The second, third, and/or fourth heating assembly can be used to keep the first housing 31 hot. Keeping the first housing 31 hot reduces the likelihood that gas-phase substances might condense on the housing walls and potentially contaminate the substrates being processed.

While the first housing 31 is being heated by the heating assemblies, the second housing 33 remains cool. As illustrated in FIG. 1(a), the second housing 33 is spaced from the first housing 31. Fluid passages (not shown) can be present in the walls of the second housing 33 so that a cooling fluid (e.g., water) can flow through the second housing 33 to keep it cool. In an exemplary curing process embodiment, the first housing 31 may be maintained at about 425° C. while the second housing 33 may be maintained at about 50° C.

An exhaust tube 48 and a cold trap 43 are coupled to the first heating assembly 101 and can receive exhaust gas flowing downstream of the first heating assembly 101. Any suitable cold trap may be used. Suitable cold traps are commercially available from Norcal, Inc. An outer tube 47 is also disposed around the exhaust tube 48.

When the heating apparatus 10 is operating, the exhaust tube 48 can be hot while the outer tube 47 can remain cool. As the linear actuator 75 moves the plurality of cell structures 35 and the first heating assembly 101 up and down, the exhaust tube 48 can move along with the plurality of cell structures 35 while the outer tube 47 and the cold trap 43 remain stationary.

One or more pumps (not shown) may be included in the heating apparatus 10 and can be operatively coupled to the first housing 31 and the second housing 33. The one or more pumps can be used to pump down the interior of the first housing 31 and the interior of the second housing 33. In some embodiments, low pressures are desirable to minimize the amount of oxygen within the first housing 31 and the second housing 33. For example, oxygen is a reactive gas that could unintentionally react with a sol-gel layer that is being cured. Oxygen can also affect the processing in other ways. For instance, substantial amounts of oxygen gas in the heating apparatus 10 may slow down a curing process being performed in the heating apparatus 10.

An illustrative method can be described with reference to FIG. 1(a). Referring to FIG. 1(a), a feed gas flows through the feed gas tubes 41 to the first heating assembly 101. The feed gas may comprise an inert gas. Suitable inert gases include nitrogen, argon, and mixtures thereof. As noted above, in some embodiments, it is desirable to minimize the amount of reactive gas (e.g., oxygen) in the heating apparatus to avoid unintentional reactions on the substrates that are being processed. However, in other embodiments of the invention, components of the feed gas could be reactive if reactions are to take place on the substrates being processed. Reactive gases such as oxygen, silanes, etc. could also be used to deposit layers on the substrates in other embodiments.

In embodiments of the invention, the feed gas can serve multiple purposes. For example, after the first heating assembly 101 heats a feed gas, the feed gas helps to conduct heat throughout the plurality of cell structures 35. This keeps the plurality of cell structures 35 hot. The hot cell structures, along with heat from other sources (e.g., the heated first housing 31), provide heat to heat the substrates in the plurality of cell structures 35. Keeping the plurality of cell structures 35 hot also reduces the likelihood that gas-phase substances might condense at the surfaces of the plurality of cell structures 35. By minimizing the likelihood of condensation within the first and second housings 31, 33, the potential for contaminating the substrates is minimized. In addition, after passing downstream of the substrates being processed, the feed gas can form an exhaust gas. The exhaust gas can carry byproducts of the process being performed on the substrates downstream of the substrates. This also reduces the possibility that the byproducts might redeposit onto the substrates (e.g., by condensation) in the plurality of cell structures 35 and contaminate them.

In the first heating assembly 101, the feed gas is heated to an appropriate temperature. In the illustrated example, four heated feed gas streams can be fed to the first heating assembly 101 through four feed gas tubes 41 underneath the first heating assembly 101. Each heated feed gas stream can supply feed gas to one or more cell structures in the plurality of cell structures 35. More specifically, once the feed gas streams reach the plurality of cell structures 35, they pass through internal gas passages in the plurality of cell structures 35. Gas is then distributed into the interiors of the cell structures through gas distribution holes in the gas permeable elements forming the cell structures.

As noted above, once a feed gas passes downstream of a substrate, it can be characterized as an exhaust gas. Exhaust gas passing downstream of the substrates passes into exhaust holes in the gas permeable elements forming the individual cell structures. After passing into a set of exhaust gas holes in a cell structure, an exhaust gas stream is formed. The exhaust gas stream then flows through internal gas passages in the plurality of cell structures 35 and in the first heating assembly 101. For example, in the heating apparatus shown in FIG. 1(a), four exhaust gas streams may be formed in the four cell structures. The exhaust gas streams can then pass through internal gas passages in the plurality of cell structures 35 and can merge into a single exhaust gas stream in the first heating assembly 101.

The single exhaust gas stream can then flow through the exhaust tube 48, and then to the cold trap 43. The exhaust gas flowing downstream of the plurality of cell structures 35 can remain hot until the cold trap 43 receives it. By doing so, gas-phase substances (e.g., water vapor, gas-phase surfactants) in the exhaust gas are less likely to condense inside of the first housing 31. This reduces the possibility of contaminating the substrates within the plurality of cell structures 35 with condensed substances. Consequently, embodiments of the invention can provide for improved product yields. After the exhaust gas stream is received in the cold trap 43, the gas-phase substances can condense in the cold trap 43. The condensed substances can be subsequently removed from the heating apparatus 10 by emptying the contents of the cold trap 43.

FIG. 1 (b) shows a more detailed view of the first heating assembly 101 and the plurality of cell structures 35. In this example, the plurality of cell structures 35 is over and on the first heating assembly 101.

The first heating assembly 101 may include any suitable number of components. In the example shown in FIG. 1(b), the first heating assembly 101 includes a heating assembly cover 101(a), a heating element 101(b), a gas distribution element 101(c), and a bottom plate 101(d). Each of these components is described in further detail below. In other embodiments, more or less components may be included in the first heating assembly 101. For example, in some embodiments, the first heating assembly 101 may simply consist of a single heating element in the form of a unitary body.

Figure 1B:
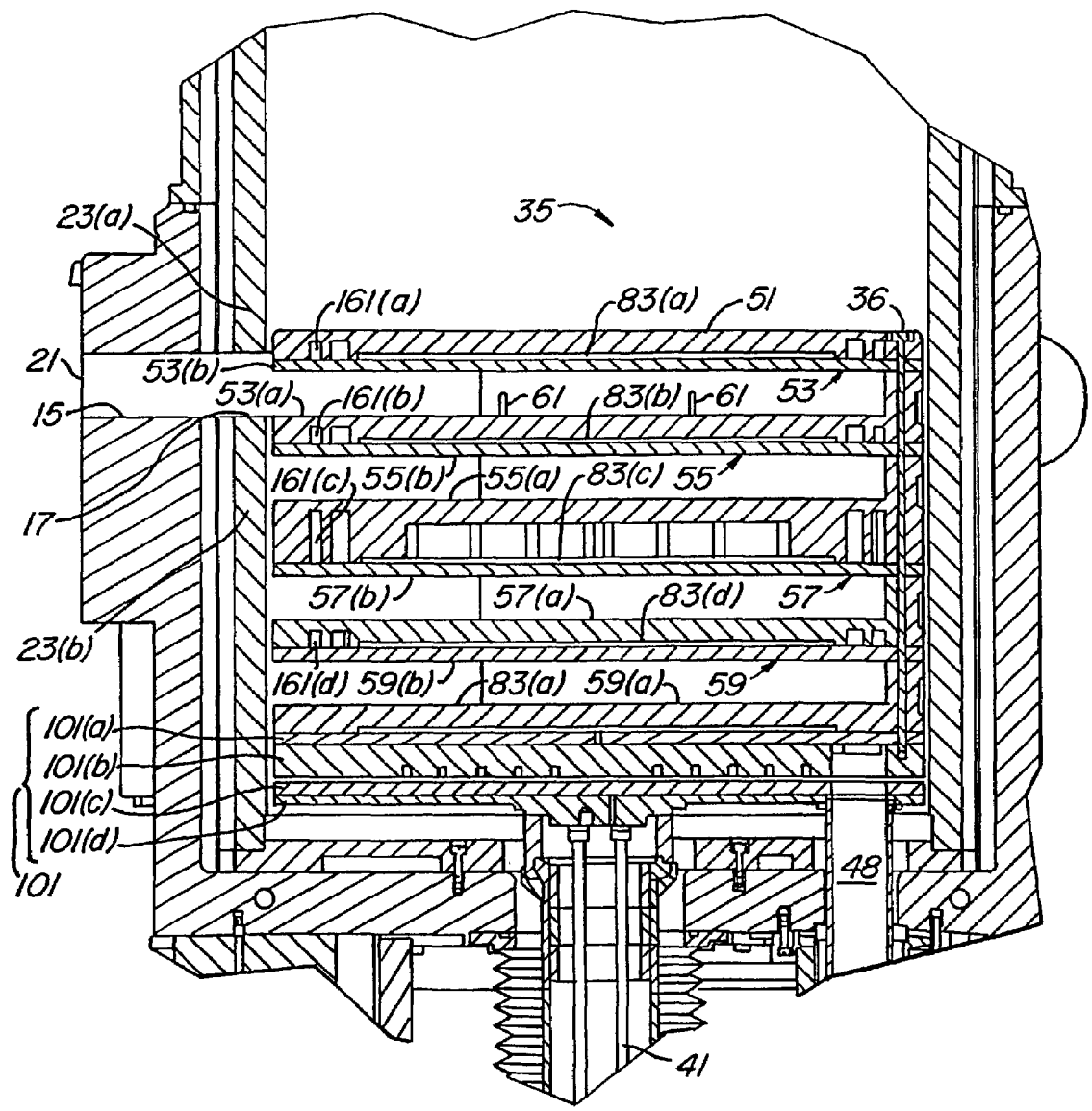
FIG. 1(b) shows an enlarged portion of the cross-section shown in FIG. 1(a).

In the example shown in FIG. 1(b), there are four cell structures 53, 55, 57, 59 in the plurality of cell structures 35. A top cover element 51 is at the top of the plurality of cell structures 35. Although the plurality of cell structures 35 is illustrated as consisting of four cell structures 53, 55, 57, 59, any suitable number of cell structures may be in the plurality of cell structures in embodiments of the invention. For instance, in embodiments of the invention, there may be at least about three, or even at least about four cell structures in the plurality of cell structures 35.

The cell structures 53, 55, 57, 59 according to embodiments of the invention can have any suitable configuration and can be made of any suitable material (e.g., stainless steel). For example, first gas permeable elements 53(a), 55(a), 57(a), 59(a) form bottom portions of the cell structures 53, 55, 57, 59. Corresponding 20 second gas permeable elements 53(b), 55(b), 57(b), 59(b) form top portions of the cell structures 53, 55, 57, 59. Gas permeable elements in respective pairs of first gas permeable elements and second gas permeable elements 53(a)-53(b), 55(a)-55(b), 57(a)57(b), 59(a)-59(b) can face each other. They can also face substrates that are spaced from and disposed between the respective pairs of gas permeable elements 53(a)-53(b), 25 55(a)-55(b), 57(a)-57(b), 59(a)-59(b).

In the example shown in FIG. 1(b), the first gas permeable elements 53(a), 55(a), 57(a), 59(a) are in the form of gas permeable trays. Each tray has a rim that partially surrounds a major surface of the tray. An upper surface of each tray may have gas distribution holes in it, while the bottom surface of each tray may have a 30 number of channels. Some channels at the bottom surface of each tray may form gas passages for exhaust gas while other channels may form gas passages for a feed gas. A single cell structure may be formed by coupling the gas permeable plate to the rim of the tray. The formed cell structure has a back wall that is formed by the rim of the gas permeable tray. An opening to the interior of the cell structure is present at the front where there is no rim.

In this example, the second gas permeable elements 53(b), 55(b), 57(b), 59(b) are in the form of gas permeable plates. Both the upper surface and the bottom surface of each of the second gas permeable elements 53(b), 55(b), 57(b), 59(b) may be generally planar and smooth. Gas distribution holes may be present in each of the second gas permeable elements 53(b), 55(b), 57(b), 59(b).

Alignment elements 36 can pass through the rear of the plurality of cell structures 35 to align the first gas permeable elements 53(a), 55(a), 57(a), 59(a) with the second gas permeable elements 53(b), 55(b), 57(b), 59(b), and also to couple these elements together. An example of a suitable alignment element is an alignment pin. Adjacent gas permeable elements may be additionally coupled together by processes such as brazing or welding. The top cover element 51 can also be coupled to the top second gas permeable element 53(b) by a process such as welding or brazing.

Support pins 61 extend from the first gas permeable element 53(a) of the top cell structure 53. The support pins 61 can support a substrate in the cell structure 53. Only one set of support pins is shown in FIG. 1(b) for clarity of illustration. It is understood that support pins for supporting substrates may be in the other cell structures 55, 57, 59 in the heating apparatus 10.

A suitable number of internal gas passages of any suitable dimension may be present in the plurality of cell structures 35 to deliver gas to the gas distribution holes in the first and second gas permeable elements 53(a), 53(b), 55(a), 55(b), 57(a), 57(b), 59(a), 59(b). One set of enclosed regions 83(a)-83(e) can be in communication with gas distribution holes (not shown) in the first and second gas permeable elements 53(a), 53(b), 55(a), 55(b), 57(a), 57(b), 59(a), 59(b). The topmost enclosed region 83(a) is formed by channels at the bottom of the top cover element 51 and the topmost second gas permeable element 53(b).

When the heating apparatus is in operation, feed gas can be delivered to each enclosed region 83(a)-83(e) through internal gas passages in the plurality of cell structures 35. The feed gas can then pass from the enclosed regions 83(a)-83(e) to the interiors of the cell structures 53, 55, 57, 59 through the gas distribution holes in the first and second gas permeable elements 53(a), 53(b), 55(a), 55(b), 57(a), 57(b), 59(a), 59(b).

The plurality of cell structures 35 may also include internal passages for exhaust gas. For example, outer horizontal gas passages 161(a)-161(d) can be at the peripheral regions of the first gas permeable elements 53(a), 55(a), 57(a), 59(a). The outer gas passages 161(a)-161(d) can surround the enclosed regions 83(a)-83(d). Exhaust gas from the interiors of the cell structures 53, 55, 57, 59 can pass into the outer horizontal gas passages 161(a)-161(d) through gas exhaust holes (not shown) in the second gas permeable elements 53(b), 55(b), 57(b), 59(b).

In the example shown in FIG. 1(b), four separate exhaust gas streams in the cell structures 53, 55, 57, 59 can be formed. These four separate exhaust gas streams can then flow vertically through gas passages that extend down the rear and side regions of the plurality of cell structures 35. In the illustrated embodiment, the four separate exhaust gas streams can merge into a single exhaust gas stream at the top side of the heating element 101(b). The single exhaust gas stream then passes to the exhaust tube 48 and to a cold trap (not shown) downstream of the first heating assembly 101.

Embodiments of the invention are not limited to the particular heating apparatus designs shown in FIGS. 1 (a) and 1 (b). For example, although two gas permeable elements are used to form each cell structure in the illustrated embodiments, in other embodiments, one gas permeable element and one substantially gas impermeable element could be used to form a cell structure. Also, although in FIGS. 1(a) and 1(b), the first gas permeable elements 53(a), 55(a), 57(a), 59(a) are in the form of trays and the second gas permeable elements 53(b), 55(b), 57(b), 59(b) are in the form of plates, other structures are possible. For instance, the first and second gas permeable elements could both be gas permeable plates with a spacer block between the plates. The spacer block could serve the same purpose as the rim in the tray described above.

Figure 2:
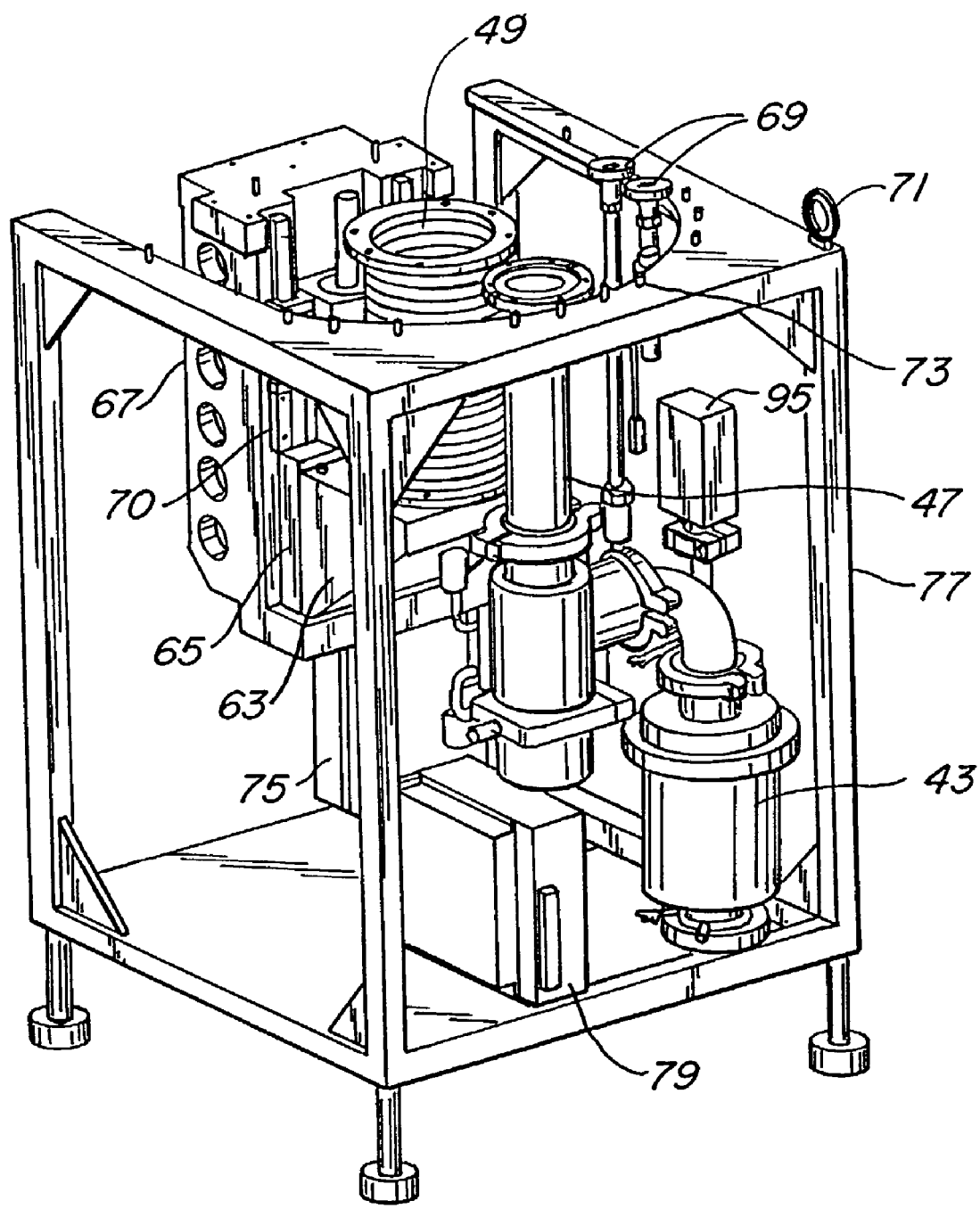
FIG. 2 shows a perspective view of various components in a bottom portion of a heating apparatus according to an embodiment of the invention.

FIG. 2 shows a perspective view of various components in a bottom portion of a heating apparatus according to an embodiment of the invention. FIG. 2 shows a frame 77 that supports the second housing (not shown) of the heating apparatus. Ring structures 71 may be in the frame 77 so that the heating apparatus can be easily transported and positioned in a manufacturing facility. A bracket 67 (e.g., an aluminum bracket) can be coupled to the second housing and can be disposed within the frame 77.

A table 65 and a lift carrier 63 may be disposed under a flexible bellows 49 and may be coupled to the bracket 67. The table 65 and the lift carrier 63 may be within the frame 77 and may support the plurality of cell structures and the first heating assembly (not shown). In some embodiments, the table 65 and the lift carrier 63 may be one unitary structure instead of two separate structures. Linear guides 70 on the bracket 67 can be used to guide the vertical-movement of the table 65 and the lift carrier 63 to an appropriate vertical position. Suitable linear guides can be obtained from THK America, Inc. of Livermore, Calif.

A linear actuator (e.g., a servo motor) 75 is coupled to the lift carrier 63 and the table 65. The linear actuator 75 can move the lift carrier 63, the table 65, the plurality of cell structures and the first heating assembly up and down in a vertical direction. The linear actuator 75 can be capable of moving any suitable load. For example, the linear actuator 75 can be capable of moving a load of about 500 pounds or more. A controller 79 for controlling the linear actuator 75 may also be disposed in the frame 77 and operatively coupled to the linear actuator 75. Suitable linear actuators and controllers are commercially available from Yaskawa Electric, Inc.

A pressure gauge 95 (e.g., a Parini gauge) is coupled to the cold trap 93. The pressure gauge 95 can be used to monitor the pressure of the gas upstream of the cold trap 93. The cold trap 93 is coupled to an outer tube 47, which can partially house the gas exhaust tube (not shown). The outer tube 47 can be cool while the gas exhaust tube inside of the outer tube 47 can be hot.

Coolant pipes 69 for transporting cooling fluids such as water or ethylene glycol may be within the frame 77. The coolant pipes 69 can supply a cooling liquid such as water to interior fluid passages in the second housing to keep it cool. The coolant pipes 69 can have appropriate fittings for connections to other pipes or fluid passages. A coolant source can be in communication with the coolant pipes 69.

Figure 3:
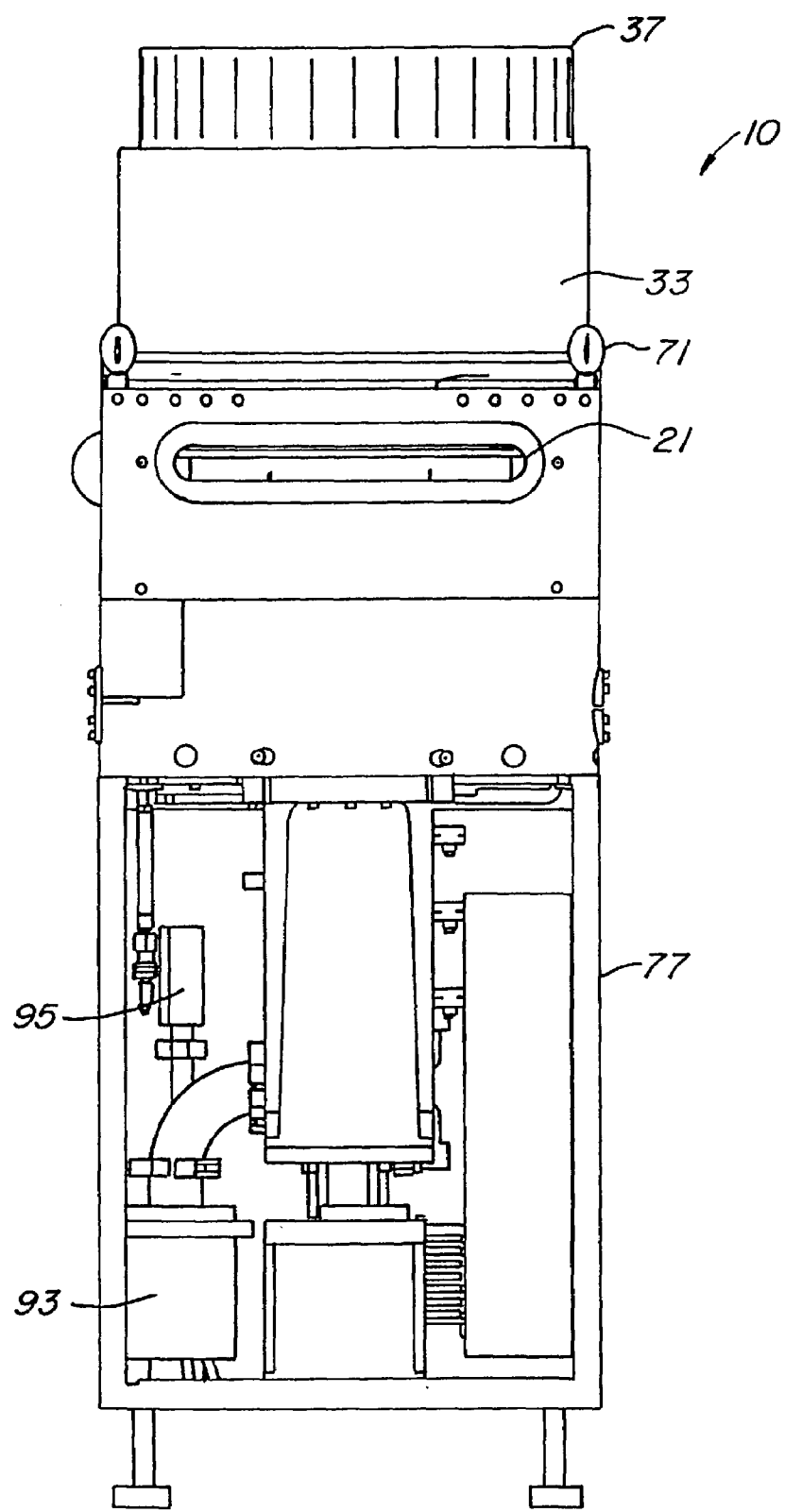
FIG. 3 shows a front view of a heating apparatus according to an embodiment of the invention.

FIG. 3 shows a frontal view of a heating apparatus 10 according to an embodiment of the invention. The front of the heating apparatus 10 has an entrance 21 that is shaped as an elongated slit. A slit valve may be present to open and close the slit. A loadlock (not shown) may be at the front of the heating apparatus 10 and may cover the entrance 21 to provide a vacuum interface for the heating apparatus 10. As shown in FIG. 3, the heating apparatus 10 can be vertically oriented and can have a small footprint.

In this example, the entrance 21 is narrow and allows the passage of a single substrate through it. The use of the narrow entrance 21 has some advantages over using a larger entrance. For example, the narrow entrance 21 also helps to keep the interior of the heating apparatus 10 hot. Larger entrances could cause greater internal temperature fluctuations than smaller entrances. For example, more heat inside of the heating apparatus can escape through a large opening as compared to a small opening. Also, because the entrance 21 is narrow, a smaller loadlock can be used at the front of the heating apparatus 10 than if the entrance was large. A smaller loadlock reduces the overall cost and the complexity of the heating apparatus 10. Of course, in other embodiments, the entrance 21 to the heating apparatus 10 could be larger than the narrow slit entrance 21 shown in FIG. 3.

Figure 4:
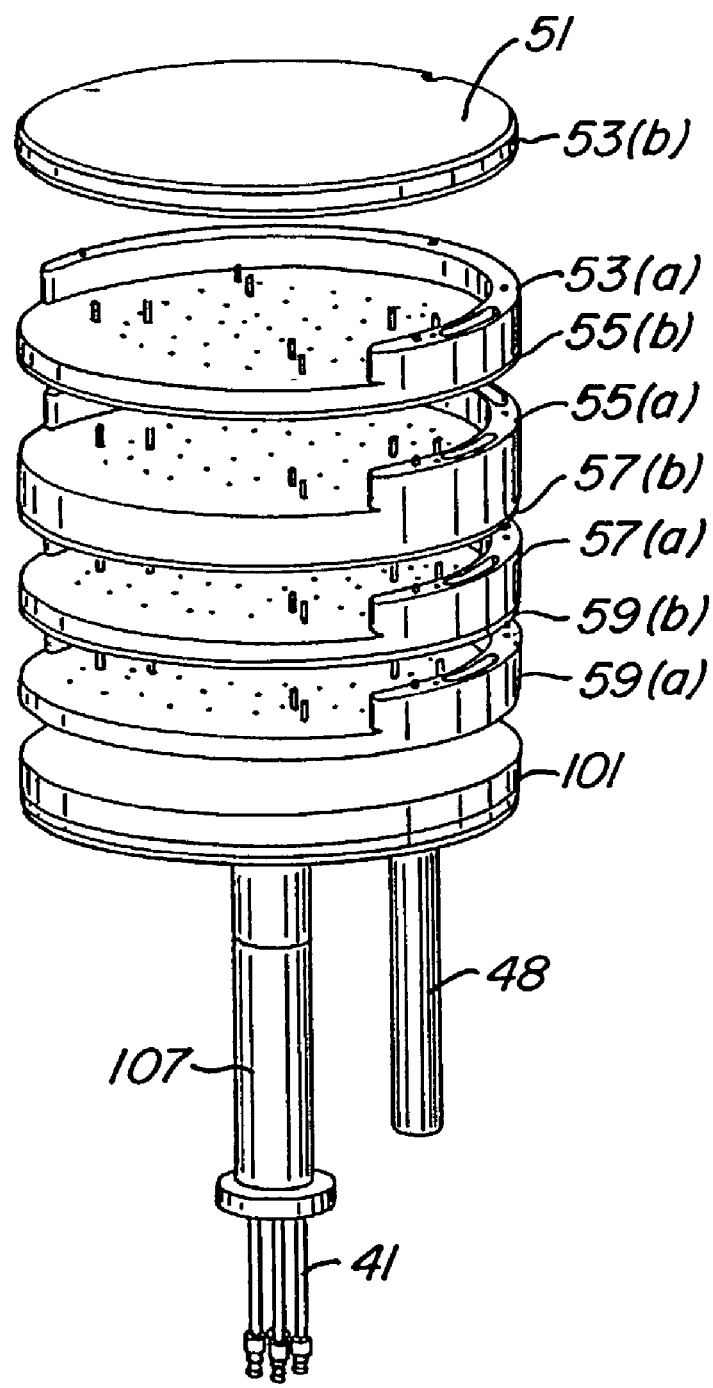
FIG. 4 shows an exploded view of the plurality of stacked cell structures and a first heating assembly according to an embodiment of the invention.

FIG. 4 shows an exploded view of the plurality of cell structures 35 and an unexploded view of the first heating assembly 101. As illustrated in FIG. 4, the various gas permeable elements 53(a), 53(b), 55(a), 55(b), 57(a), 57(b), 59(a), 59(b) in the plurality of cell structures 35 can be separately formed and then assembled together along with the first heater assembly 101 and a cover element 51. Also, as shown in FIG. 4, the cover element 51, the gas permeable elements 53(a), 53(b), 55(a), 55(b), 57(a), 57(b), 59(a), 59(b), and the first heating assembly 101 may have disk-like shapes.

Figure 5:
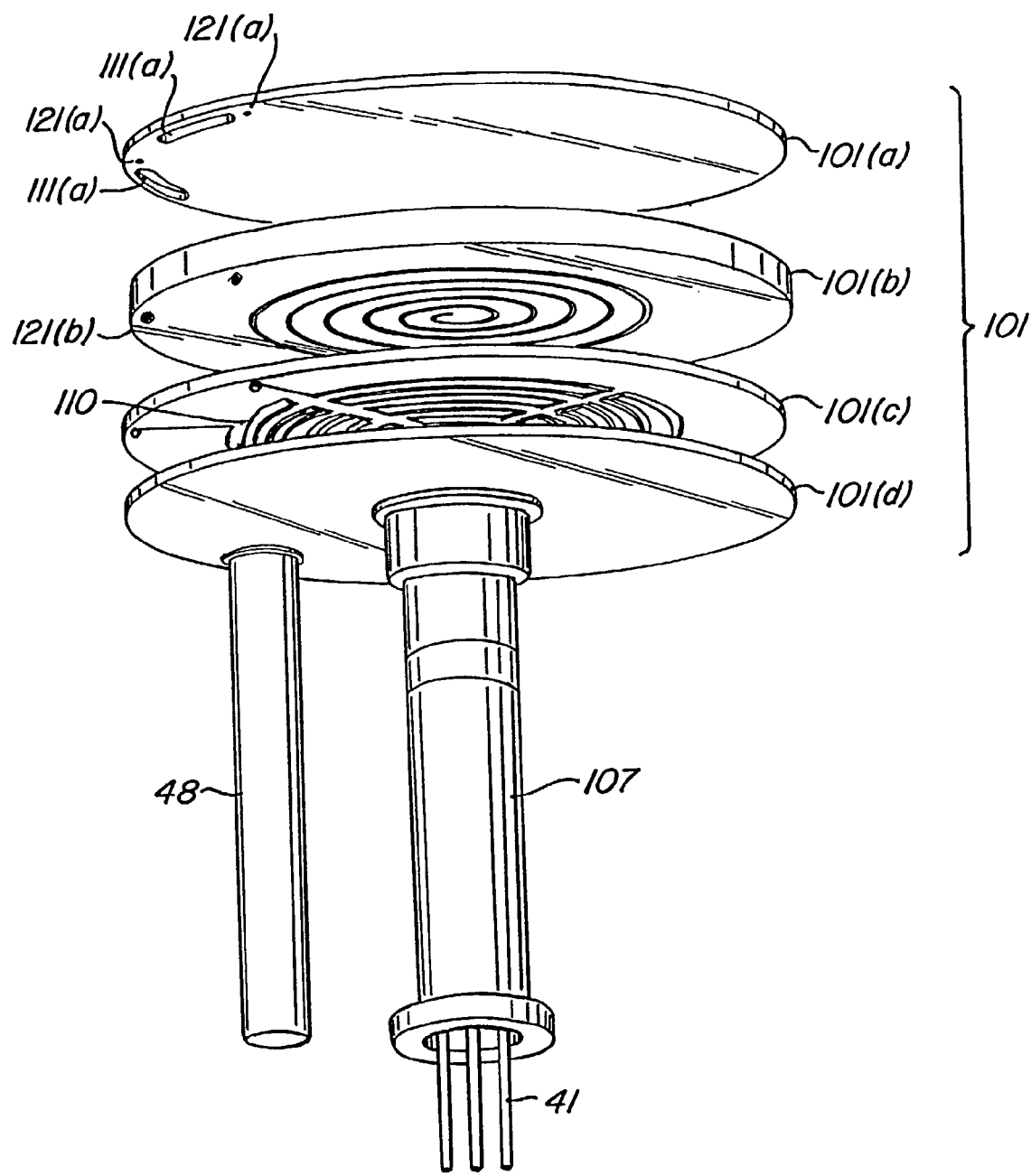
FIG. 5 shows an exploded view of a first heating assembly as viewed from the bottom.
Figure 6:
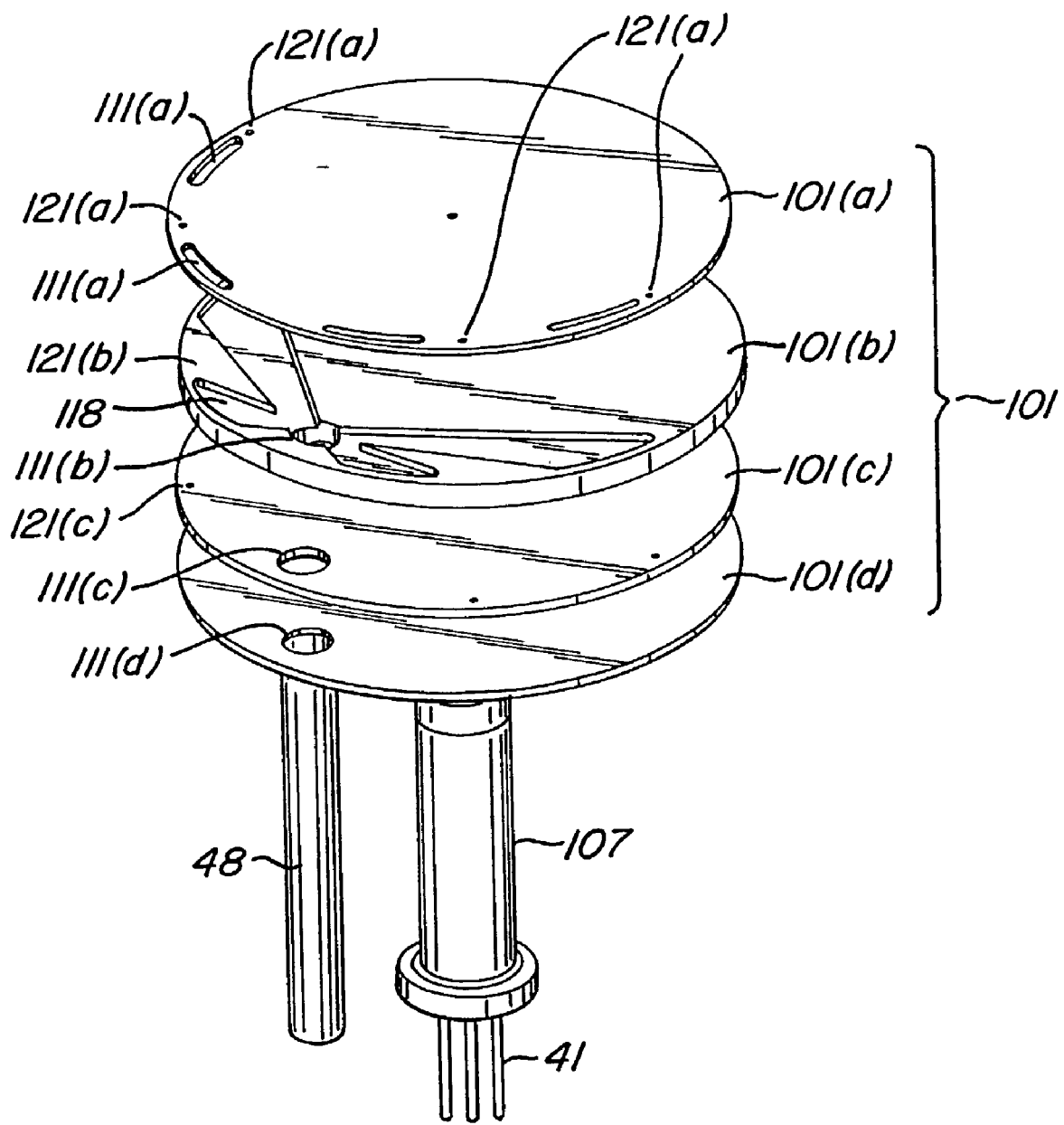
FIG. 6 shows an exploded view of the first heating assembly shown in FIG. 5 as viewed from the top.

Details of the first heating assembly 101 are described with reference to FIGS. 5 and 6. FIG. 5 shows an exploded view of the first heating assembly 101 as viewed from the underside of the first heating assembly 101. FIG. 6 shows an exploded view of the first heating assembly 101 as viewed from the top side of the first heating assembly 101. As shown in both FIGS. 5 and 6, in this example, the first heating assembly 101 includes, from top to bottom, a heating assembly cover 101(a), a heating element 101(b), a gas distribution element 101(c), and a bottom plate 101(d).

The heating assembly cover 101(a) can have a substantially impermeable central portion. Gas inlet holes 121(a) and gas outlet holes 111(a) are present near the periphery of the heating assembly cover 101(a). When the heating apparatus is in operation, feed gas passes upward through the gas inlet holes 121(a) to the plurality of cell structures (not shown) above the heating assembly cover 101(a). Exhaust gas from the plurality of cell structures passes down through the gas outlet holes 111(a).

An exhaust tube 48 extends downward from the first heating assembly 101. A rigid outer tube 107 is parallel to the exhaust tube 48 and also extends downward from the first heating assembly 101. The rigid outer tube 107 surrounds the four feed gas tubes 41 that supply feed gas to the plurality of cell structures. Electrical wires (not shown) that supply electricity to the heating element in the first heating assembly 101 may also be in the rigid outer tube 107.

The heating element 101(b) may include any suitable heating device. For example, in some embodiments, the heating element 101(b) includes a resistive heating coil that is embedded within an insulating medium such as an insulating ceramic. Alternatively, the heating element could comprise a heated fluid flowing through fluid passages in the heating element. In either embodiment, a temperature controller (not shown) may be coupled to the heating element 101(b) for controlling the temperature of the heating element 101(b).

The gas distribution element 101(c) has channels formed in a rigid plate at its bottom surface. The upper surface of the gas distribution element 101(c) may be smooth. When the gas distribution element 101(c) is placed adjacent to the substantially impermeable bottom plate 101(d), tortuous gas passages 110 are formed. Feed gas streams can be heated by the heating element 101(b) as they flow through the tortuous gas passages 110.

Illustratively, referring to FIG. 5, feed gas streams can be introduced through the feed gas tubes 41 disposed in a rigid outer tube 107. After passing through the gas feed tubes 41, the feed gas streams can pass to gas passages 110 in the gas distribution element 101(c). The paths formed by the gas passages 110 are tortuous. As the feed gas streams flow through the gas passages 110, they are heated by heat from the heating element 101(b). The heated feed gas streams pass through vertical gas passages formed by the gas inlet holes 121(b) at the peripheral regions of the heating element 101(b) and the gas inlet holes 121(a) at the peripheral regions of the top cover 101(a). After passing through the gas inlet holes 121(a), 121(b), the heated feed gas streams pass to the plurality of cell structures (not shown) above the heating assembly 101 where the feed gas is eventually distributed in the interiors of the cell structures.

Referring to FIG. 6, the upper surface of the heating element 101(b) has four channels 118 that converge to a gas outlet hole 111(b). The four channels 118 respectively receive exhaust gas from four gas outlet holes 121(a) in the heating assembly cover 101(a). Four separate exhaust gas streams flow through four channels 118. As the separate exhaust gas streams flow through the four channels 118, they are heated by the heating element 101(b). The four heated exhaust gas streams converge into a single exhaust gas stream at the gas outlet hole 111(b). The single exhaust gas stream then passes through a gas outlet hole 111(c) in the gas distribution element 101(c) and a gas outlet hole 111(d) in the bottom plate 101(d). The gas outlet holes 111(b), 111(c), 111(d) can form a vertical gas passage that is in communication with the exhaust tube 48. In embodiments of the invention, feed gas and exhaust gas can pass vertically and horizontally through the first heating assembly 101 simultaneously, and in opposite directions.

Advantageously, as shown in FIGS. 5 and 6, in embodiments of the invention, a single heating element (e.g., the heating element 101(b) in the heating assembly 101) can be used to efficiently heat both a feed gas and an exhaust gas. Feed gas passing to the plurality of cell structures can be heated with the heating element to provide heat to the plurality of cell structures. Exhaust gas passing downstream of the plurality of cell structures can be heated with the same heating element. By keeping the exhaust gas hot, gas-phase substances in the exhaust gas do not condense near the substrates in the cell structures. In embodiments of the invention, multiple heating elements need not be used to heat the various gases flowing through the apparatus. This improves the thermal budget and reduces the cost and the complexity of the heating apparatus.

Figure 7:
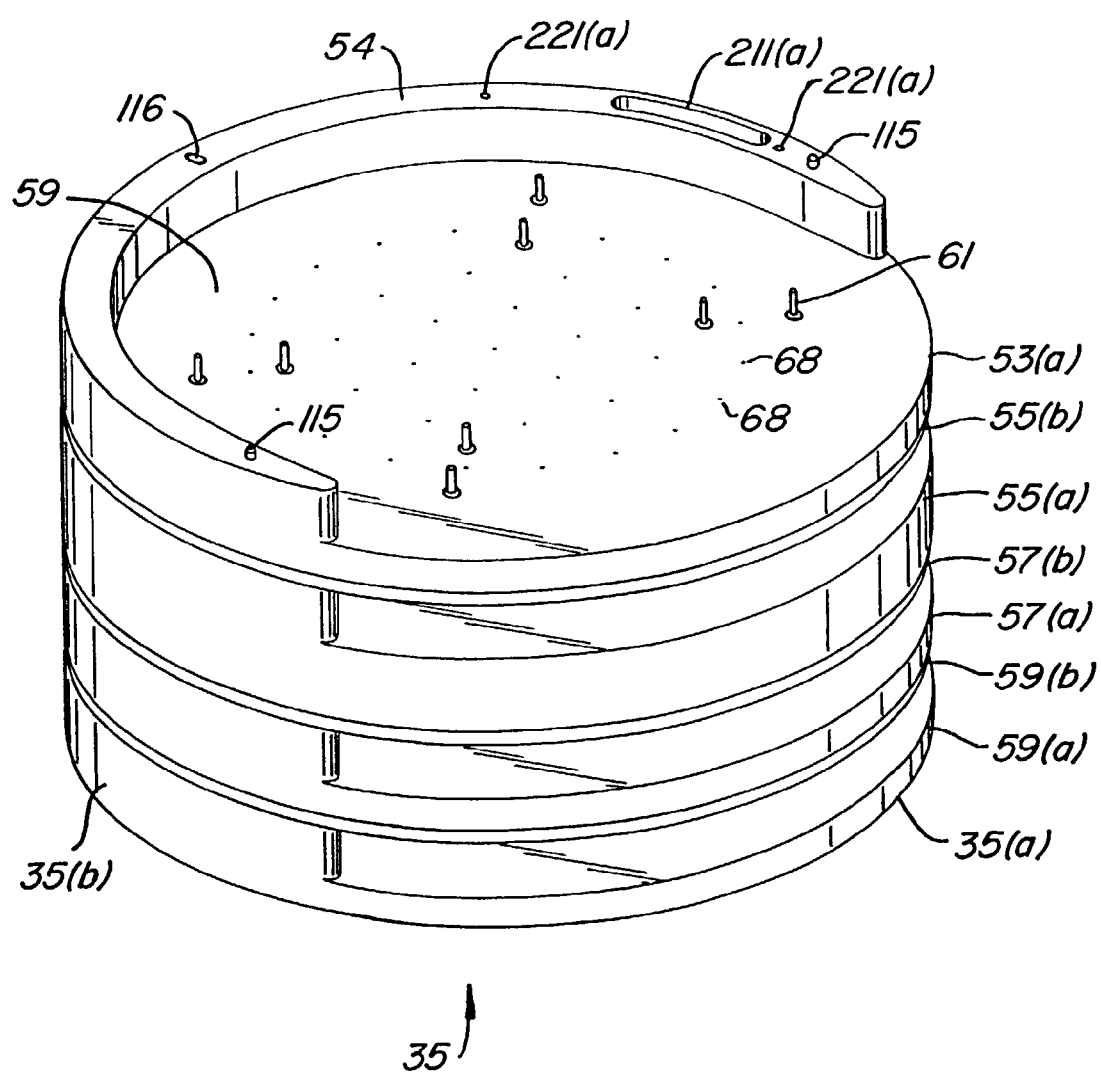
FIG. 7 shows a perspective view of a plurality of stacked cell structures according to an embodiment of the invention.

FIG. 7 shows a plurality of cell structures 35 having a front region 35(a) and a rear region 35(b). The cell structures in the plurality of cell structures 35 are stacked on top of each other. First gas permeable elements 53(a), 55(a), 57(a), 59(a) are interspersed between the second gas permeable elements 55(b), 57(b), 59(b). As in the prior examples, the first gas permeable elements 53(a), 55(a), 57(a), 59(a) are in the form of trays, while the second gas permeable elements 55(b), 57(b), 59(b) are in the form of plates. The rims of the first gas permeable elements 53(a), 55(a), 57(a), 59(a) and the rear edge and side regions of the second gas permeable elements 55(b), 57(b), 59(b) form a curved wall structure. The curved wall structure corresponds to the rear and sides of the plurality of cell structures 35. Internal gas passages may extend vertically through this wall structure to provide gas to or receive gas from the interiors of the cell structures.

Support pins 61 are present on the top first gas permeable element 53(a). The support pins 61 can be in any configuration suitable for supporting a substrate to be processed. For example, in FIG. 7, two sets of support pins 61 are at two different radial positions. The two sets of support pins 61 may support substrates of different sizes. Also, the support pins 61 can be movable or non-movable in embodiments of the invention. For example, in some embodiments, the support pins 61 could be movable so that they can be withdrawn into the first gas permeable element 53(a) or extended so that they protrude from a major surface 59 of the first gas permeable element 53(a). Any suitable material may be used to form the support pins 69. For example, the support pins 61 may comprise quartz.

Using support pins 61 to support substrates during heating provides advantages. For example, if a substrate is placed directly on a hot, planar surface, the substrate may experience thermal shock. The shock could alter the properties of the layers in a substrate being processed. By placing a substrate on pins, the substrate is heated gradually and the likelihood of thermally shocking the substrate is reduced. Moreover, if a sol gel layer is being cured on a substrate, rapid heating caused by the direct contact between a hot, planar surface and the substrate may cause "bubbling" of the sol gel layer due to the vaporization of liquid in the sol gel layer. Bubbling can affect the internal or external structure of the porous dielectric layer that is formed from the sol gel layer.

A number of gas distribution holes 68 are present in the major surface 59 of the first gas permeable element 53(a). Feed gas that is between the first gas permeable element 53(a) and the second gas permeable element 55(a) passes to a substrate (not shown) on the support pins 69 through the gas distribution holes 68.

The individual gas distribution holes 68 may be in any suitable configuration and may be of any suitable size or geometry. For instance, round or conical holes can be distributed in a regular or irregular array throughout major surface 59 of the first gas permeable element 57(b) to provide for even gas flow into the interior of the cell structure formed using the first gas permeable element 57(a).

The rim 54 of the first gas permeable element 53(a) extends above the major surface 69. An alignment hole 116 for receiving an alignment element (not shown) is at the rear of the first gas permeable element 53(a). Alignment pins 115 are at opposite ends of the rim 115. The alignment pins 115 can be received in holes in a cover element (not shown) that is disposed on top of the first gas permeable element 53(a).

Figure 8:
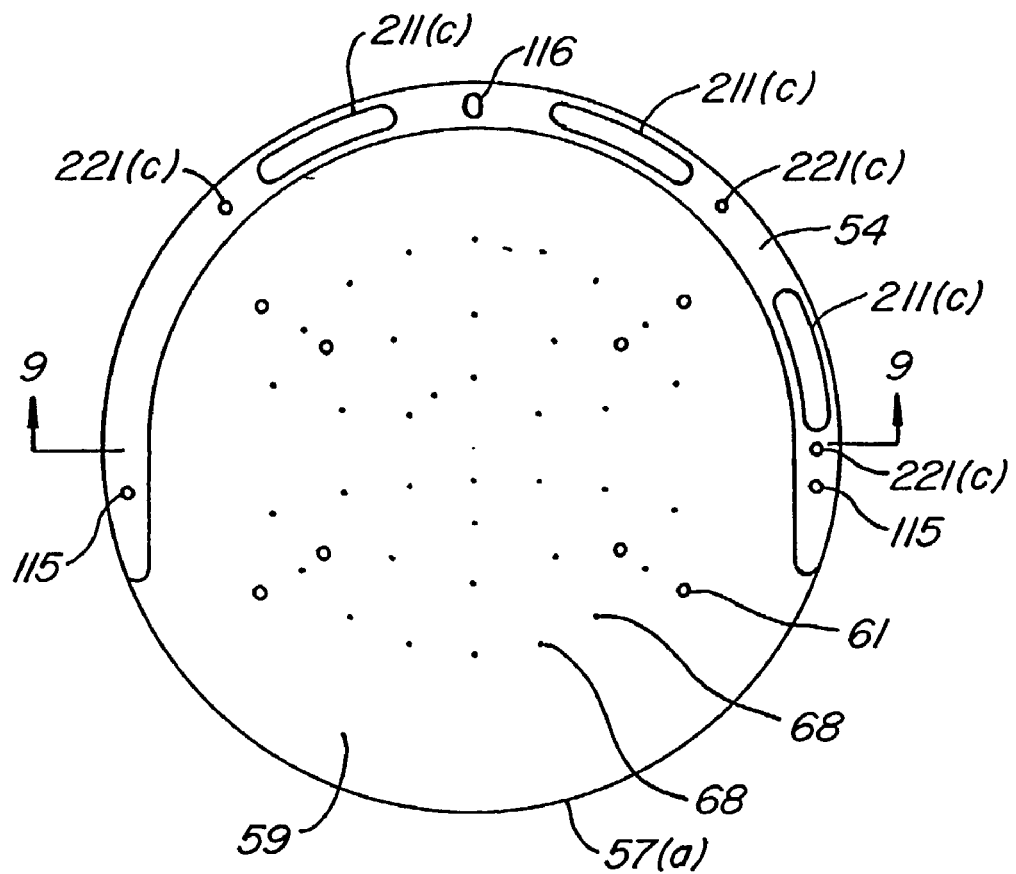
FIG. 8 shows a plan view of a first gas permeable element according to an embodiment of the invention.

FIG. 8 shows a top plan view of a first gas permeable element 57(a) according to an embodiment of the invention. The first gas permeable element 57(a) is in the form of a gas permeable tray that includes a rim 54 that partially surrounds a major surface 59. In the illustrated embodiment, the rim 54 encircles more than half of the major surface 59 of the first gas permeable element 53(a). The major surface 52 includes a number of gas distribution holes 68 through which gas may pass. Substrate support pins 61 extend upward from the major surface 52. Gas outlet holes 211(c) are present in the rim 54 and partially form gas passages with corresponding gas outlet holes in other gas permeable elements. In this example, the gas outlet holes 211(c) are in the form of elongated and curved slits. Alignment pins 115, an alignment hole 116, and gas inlet holes 221(c) are also present in the rim 54.

Figure 9:
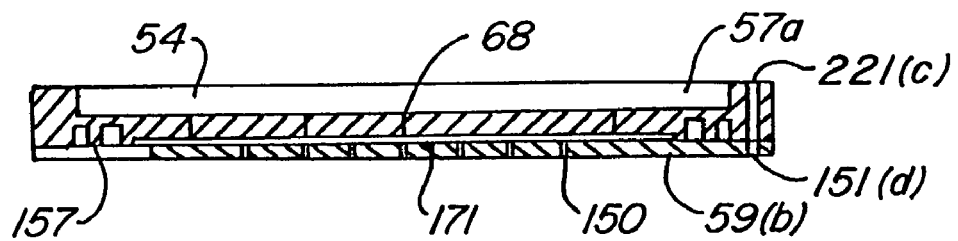
FIG. 9 shows a cross-sectional view of the first gas permeable element in FIG. 8 along the line 9-9. A cross-sectional view of a second gas permeable element under the first gas permeable element is also shown.

FIG. 9 is a cross-sectional view of the first gas permeable element 57(a) shown in FIG. 8 along the line 9-9 and is also a cross-sectional view of a second gas permeable element 59(b) under it. A gas inlet hole 221(c) in the first gas permeable element 57(a) and a second gas inlet hole 151(d) in the second gas permeable element 59(b) can form a gas passage. Feed gas can flow through the gas passage. For example, feed gas passing though the gas passage can flow upward to other gas permeable elements disposed above the first gas permeable element 57(a) and the second gas permeable element 59(b).

Channels at the bottom surface of the first gas permeable element 57(a) and the upper surface of the substantially planar second gas permeable element 59(b) underneath the first gas permeable element 57(a) form an enclosed region 171. The enclosed region 171 is in communication with the horizontal gas passage 157 in the second gas permeable element 59(b). Gas in the enclosed region 171 is distributed through gas distribution holes 68, 150 in the first and second gas permeable elements 57(a), 59(b).

Illustratively, feed gas passing from under the second gas permeable element 59(b) passes to the horizontal gas passage 157. The horizontal gas passage 157 supplies the enclosed region 171 with feed gas. The feed gas then is also distributed above the first gas permeable element 57(a) by passing through the gas distribution holes 68 in the first gas permeable element 57(a). The feed gas in the enclosed region 171 is also distributed below the second gas permeable element 59(b) by passing through the gas distribution holes 150 in the second gas permeable element 59(b).

Figure 10:
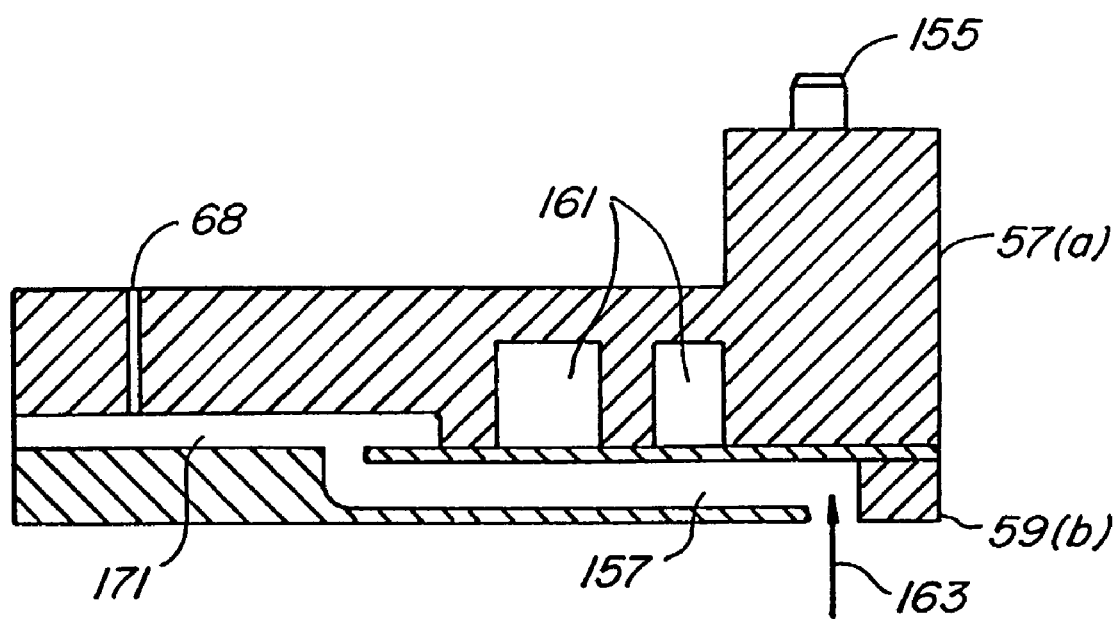
FIG. 10 shows a cross-sectional view of peripheral portions of a first gas permeable element and an underlying second gas permeable element according to an embodiment of the invention.

FIG. 10 shows a partial cross-sectional view of peripheral region of a first gas permeable element 57(a) and a second gas permeable element 59(b) under the first gas permeable element 57(a). The horizontal gas passage 157 in the second gas permeable element 59(b) is more clearly shown in FIG. 10. The horizontal gas passage 157 is in fluid communication with an enclosed region 171. A feed gas 163 can pass through the horizontal gas passage 157 into the enclosed region 171, through a gas distribution hole 68, and to a substrate (not shown) disposed above the first gas permeable element 57(a). Gas exhaust passages 161 are formed by exhaust channels at the underside of the first gas permeable element 57(a) and the upper surface of the substantially planar second gas permeable element 59(b). The gas exhaust passages 161 can be curved and can form fluid flow paths at the peripheral regions of the first and second gas permeable elements 57(a), 59(b). An alignment pin 155 can be used to align the first gas permeable element 57(b) with a second gas permeable element (not shown) directly above the first gas permeable element 57(b).

Figure 11:
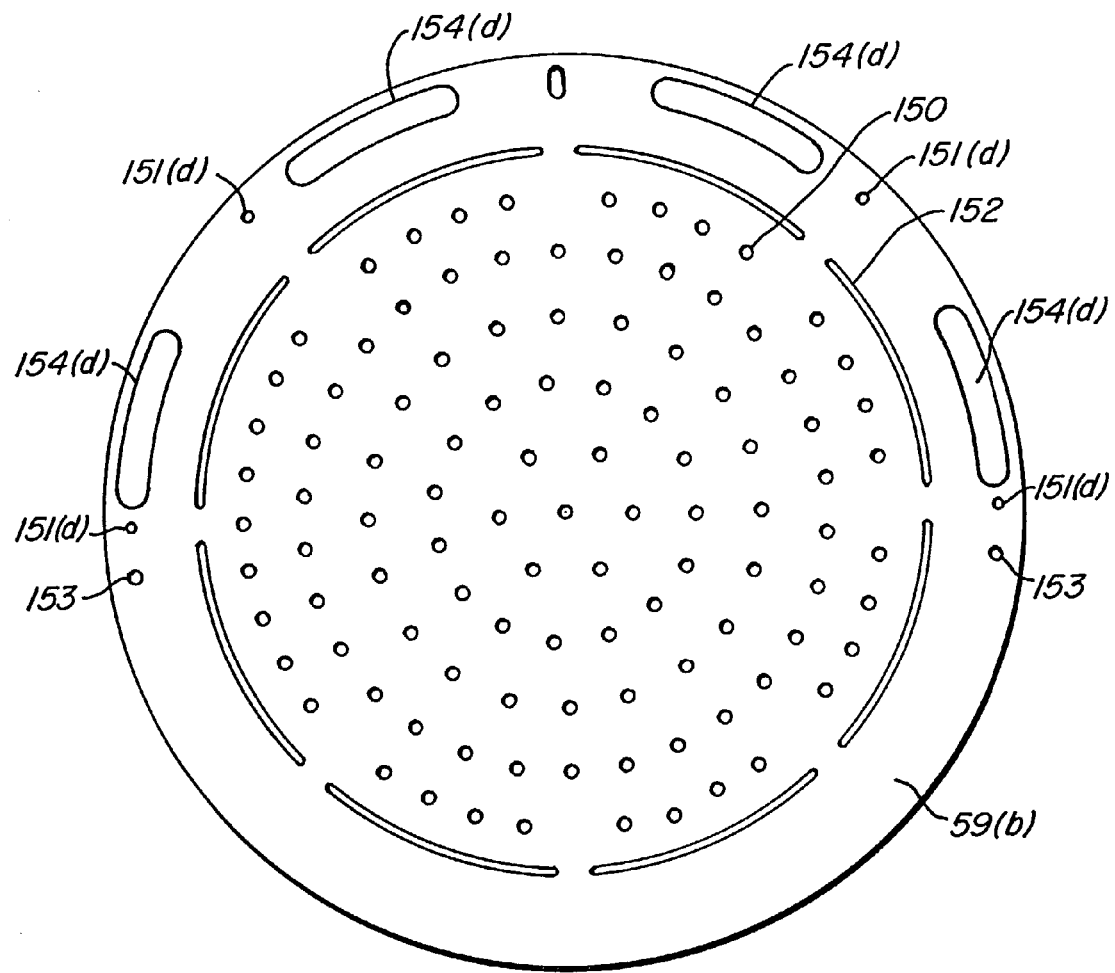
FIG. 11 shows a plan view of a second gas permeable element according to an embodiment of the invention.

FIG. 11 shows a plan view of a second gas permeable element 59(b) according to an embodiment of the invention. In this example, the second gas permeable element 59(b) is in the form of a substantially planar, gas permeable plate. Gas outlet holes 154(d), gas inlet holes 151(d), and alignment holes 153, are present at the periphery of the second gas permeable element 59(b). Gas exhaust holes 152 are disposed inwardly from the gas outlet holes 154(d). In this example, the gas exhaust holes 152 are in the form of curved slits and form a circle. An array of gas distribution holes 150 is disposed inward from the gas exhaust holes 152.

Figure 12:
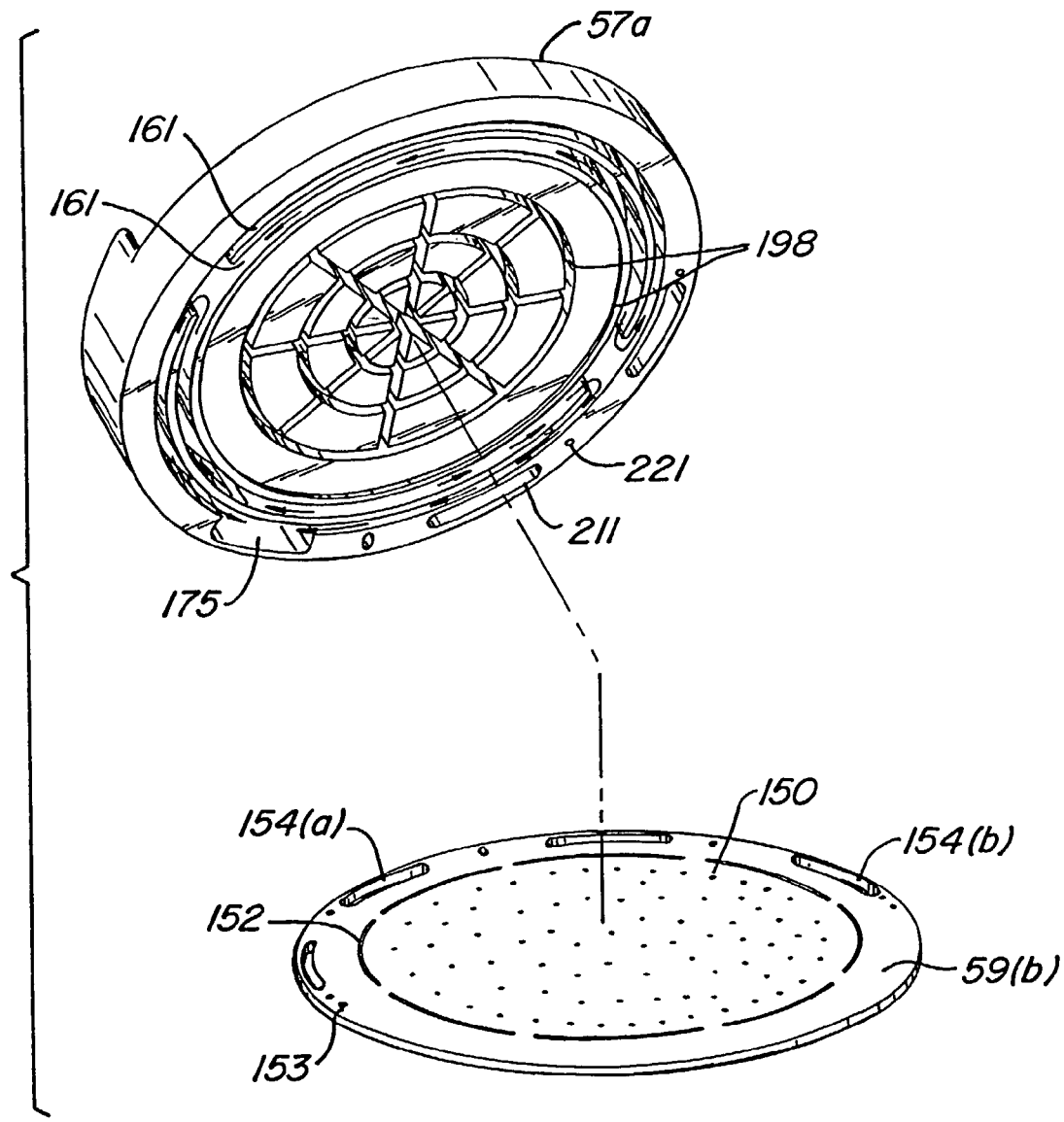
FIG. 12 shows an open, perspective view of the bottom of a first gas permeable element according to an embodiment of the invention and a second pas permeable element underneath the first gas permeable element.

The flow of exhaust gas between gas permeable elements can be described with reference to FIG. 12. Referring to FIG. 12, exhaust gas formed in the interior of a cell structure defined by the second gas permeable element 59(b) passes upward through the gas exhaust holes 152 and into the gas exhaust channels 161 formed at the bottom surface of the first gas permeable element 57(a). The gas exhaust channels 161 are in fluid communication with a gas collection region 175. The gas collection region 175 collects the exhaust gas flowing through the gas exhaust channels 161. Exhaust gas passes from the gas collection region 175 through the gas outlet hole 154(a) to form an exhaust gas stream. The formed exhaust gas stream then passes downward through other gas outlet holes in other gas permeable elements until it reaches the heating element in the first heating assembly. Once it reaches the heating element in the first heating assembly, all exhaust gas streams from the interiors of each of the cell structures are combined into a single exhaust gas stream. The single exhaust gas stream passes out of the first and second housings, into an exhaust tube, and into a cold trap.

Feed gas can pass through an internal horizontal gas passage in the second gas permeable element 59(*b*), through a hole at the upper surface of the second gas permeable element 59(*b*), and into the inner channels 198 at the bottom surface of the first gas permeable element 57(*a*). In the example shown in FIG. 12, the inner channels 198 include radial channels and circular channels that overlap. The inner channels 198 are in communication with gas distribution holes at the upper surface of the first gas permeable element 59(*b*). In the first gas permeable element 57(*a*), the inner channels 198 may contain a feed gas while the outer channels 161 may contain an exhaust gas.

Figure 13:
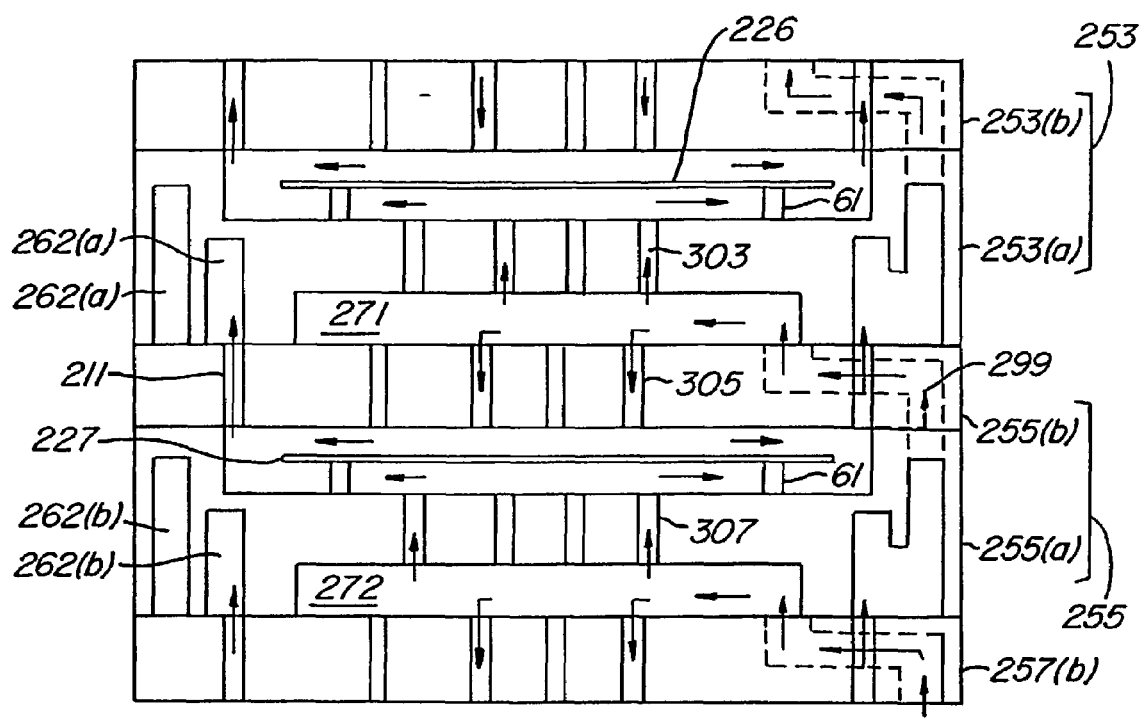
FIG. 13 is a schematic drawing of a plurality of stacked cell structures.

The flow of exhaust gas and feed gas through a plurality of stacked cell structures can be described with reference to FIG. 13. FIG. 13 shows a first cell structure 253 and a second cell structure 255, and a second gas permeable element 257(*b*) underneath the first and second cell structures 253, 255. The first cell structure 253 includes a first gas permeable element 253(*a*) and a second gas permeable element 253(*b*). The second cell structure 255 includes a first gas permeable element 255(*a*) and a second gas permeable element 255(*b*). First and second substrates 226, 227 are respectively disposed in the first and second cell structures 253, 255. The first and second substrates 226, 227 are respectively disposed on pins 61 in the first and second cell structures 253, 255. First and second enclosed regions 271, 272 contain feed gases and are between adjacent cell structures. Gas passages 262(*a*), 262(*b*) for exhaust gases are at the peripheral regions of the first gas permeable elements 253(*a*), 255(*a*).

In some embodiments, a number of feed gas streams can be supplied to the plurality of cell structures. Each feed gas stream can supply feed gas to one or more cell structures. For example, referring to FIG. 13, feed gas 299 flowing in a gas passage in the second gas permeable element 255(*b*) passes into the first enclosed region 271. Feed gas 299 in the first enclosed region 271 passes to the substrates 226, 227 in the first and second cell structures 253, 255 above and below the first enclosed region 271 through gas distribution holes 303, 305 in the first and second gas permeable elements 253(*b*), 255(*a*).

Exhaust gas formed inside of a cell structure can flow initially upward through gas exhaust holes in the second gas permeable element forming each cell structure. The exhaust gas can then flow into gas channels in the first gas permeable element above the second gas permeable element. For example, referring to FIG. 13, exhaust gas 211 passing downstream of the substrate 227 flows upward and then collects in the gas exhaust channels 262(*a*) at the peripheral regions of the first gas permeable element 253(*a*) disposed above the substrate 227. Exhaust gas streams are formed in a similar manner in other cell structures. Separate exhaust gas streams can flow downward through gas passages in the plurality of cell structures and can merge into a single exhaust gas stream at the top surface of the heating element (not shown).

Other embodiments of the invention are directed to methods for processing multiple substrates. In these embodiments, substrates can be continuously heated in some cell structures while other substrates are being inserted into or removed from other cell structures in the apparatus. For instance, one embodiment of the invention includes inserting a first substrate in a first cell structure in a plurality of stacked cell structures through an opening in a housing. The first substrate is heated in the first cell structure. The plurality of stacked cell structures is moved and a second cell structure in the plurality of stacked cell structures is aligned with the opening. A second substrate is inserted in the second cell structure through the opening, and the second substrate is heated in the second cell structure. Preferably, the second substrate is inserted into the second cell structure while the first substrate is being heated in the first cell structure. The interiors of a third cell structure, a fourth cell structure, etc. may be aligned with the opening in the same manner.

A method according to an embodiment of the invention can be described with reference to FIGS. 14(*a*)-14(*c*).

Figure 14:
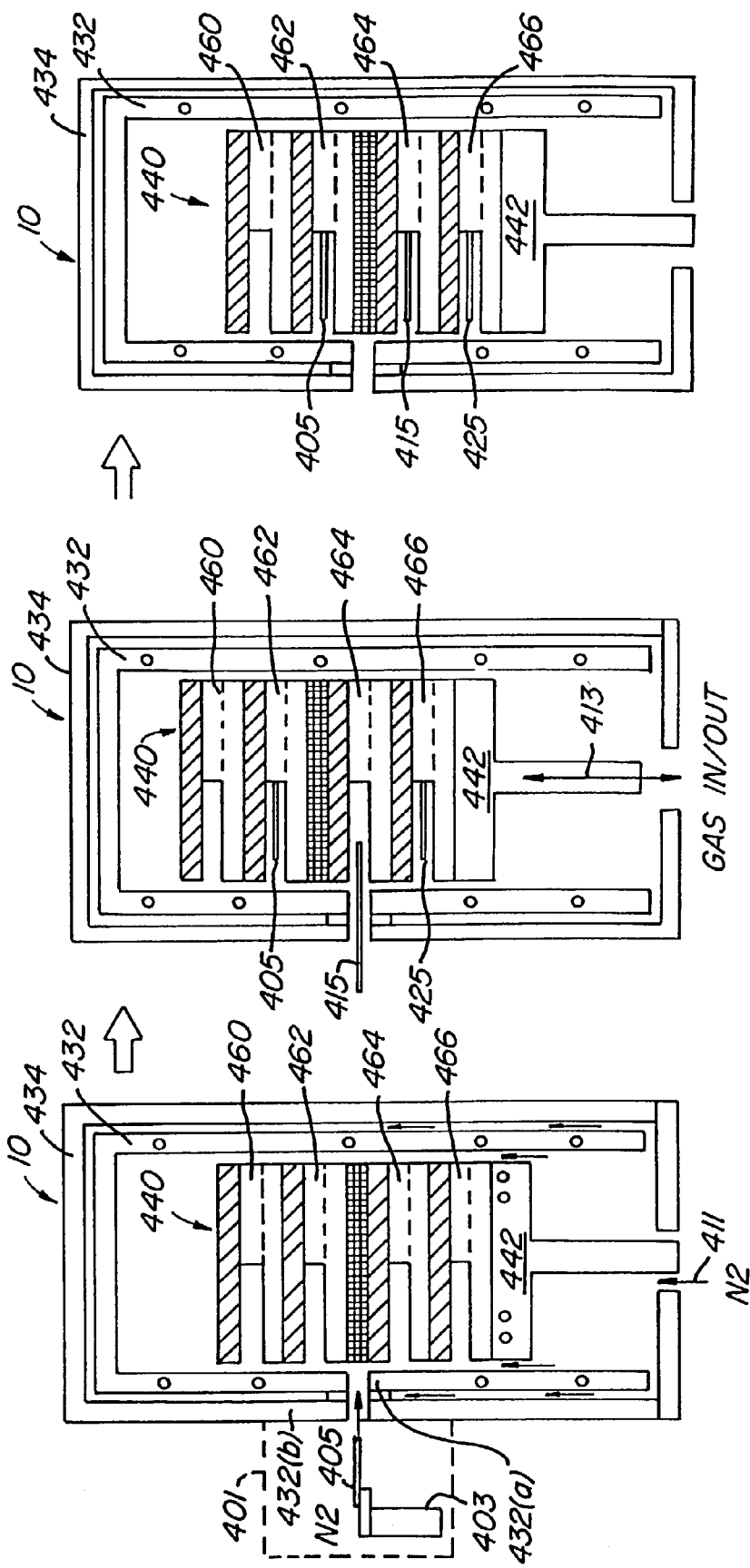
FIGS. 14(a) to 14(c) are schematic drawings showing steps in a method according to an embodiment of the invention.

FIG. 14(*a*) shows a heating apparatus 10 including plurality of stacked cell structures 440 that is disposed on a first heating assembly 442. A linear actuator (not shown) below the first heating assembly 442 can move the plurality of stacked cell structures 440 and the first heating assembly 442. Both of these components may also be housed in a first housing 432 and a second housing 434. An inert gas 411 such as nitrogen can be fed into the first housing 432 and into the space between the first and the second housings 432, 434. A buffering element (e.g., a loadlock) 401 including a buffering zone can be coupled to the second housing 434.

A robot 403 can be in the buffering element 401 to insert a substrate 405 into a cell structure or remove a substrate from within a cell structure. For example, the interior of a first cell structure 462 can be aligned with the openings 432(*a*), 434(*a*) in the first and second housings 432, 434. The robot 403 can place a first substrate 405 into the first cell structure 402. While the first substrate 405 is in the first cell structure 402, it is heated to a suitable temperature for a suitable period of time.

Referring to FIG. 14(*b*), while the first substrate 405 is being heated, an interior of a second cell structure 466 can be aligned with the openings 432(*a*), 434(*a*) in the first and second housings 432, 434 by moving the plurality of cell structures 440 upward. A second substrate 425 can then be placed in the second cell structure 466 while the first substrate 405 is being heated in the first cell structure 402. Then, while the first and second substrates 405, 425 are being heated in the first and second cell structures 402, 466, the interior of a third cell structure 464 can be aligned with the openings 432(*a*), 434(*b*) in the first and second housings 432, 434 by moving the plurality of cell structures 440 down. A third substrate 415 can then be placed in the first cell structure 464 while the first and second substrates 405, 425, 415 are being heated in the heating apparatus 10. As the substrates 405, 415, 425 are being heated, gas 413 flows in and out of the plurality of cell structures 440.

Referring to FIG. 14(*c*), the first, second, and third substrates 405, 415, 425 are being heated as the fourth cell structure 460 is aligned with the housing openings 432(*a*), 432(*b*) by moving the plurality of cell structures 35. As illustrated by this example, in embodiments of the invention, substrates can be continuously cured in the heating apparatus while other substrates can be removed from or inserted into the heating apparatus.

A method of curing curable layers on substrates can be described with reference to FIG. 15. The method illustrated in FIG. 15 can be considered a "first in first out" method of processing substrates. Substrates are introduced into different cell structures in a plurality of cell structures. In between the insertion or removal of substrates from different cell structures, the plurality of cell structures can be moved vertically, up or down, any suitable distance to align the interior of a particular cell structure with the openings in the housings of the apparatus. The specific number of substrates and cell structures in this example (as in other examples) is for illustrative purposes and it is understood that embodiments of the invention could be used to process any suitable number of substrates in any suitable number of cell structures.

Figure 15:
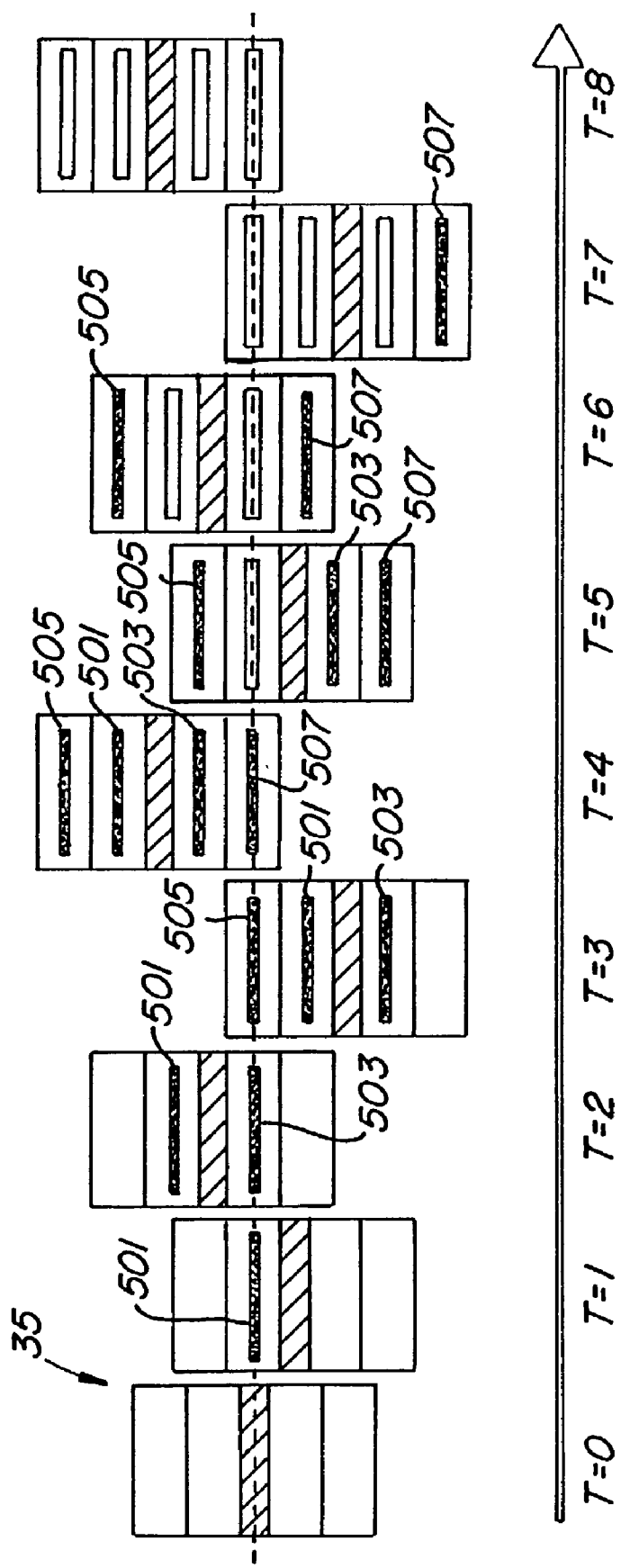
FIG. 15 is a schematic drawing showing how substrates are processed in an apparatus according to an embodiment of the invention from time T=0 to T=8.

Referring to FIG. 15, at T=0, no substrates are present in any of the four cell structures in a plurality of cell structures 35. At T=1, a first substrate 501 with a curable layer can be placed in a first cell structure. As the curable layer on the first substrate 501 is curing, the plurality cell structures 35 moves up so that an interior of a second cell structure can receive a second substrate 503 with a curable layer. At T=2, a second substrate 503 is placed in the second cell structure. Then, the plurality of cell structures 35 moves down so that at T=3, a third substrate 505 with a curable layer is placed in a third cell structure. Both of the curable layers on the first and the second substrates are being cured at T=3. Before T=4, the plurality of cell structures 35 moves upward again. At T=4, a fourth substrate 507 with a curable layer is placed in a fourth cell structure. At T=4, all cell structures in the plurality of cell structures 35 are filled with substrates but each substrate is at a different stage in the curing process.

Once the first substrate 501 is sufficiently heated so that the curable layer on it is sufficiently cured, at T=5, the first substrate 501 can be removed from the plurality of cell structures 35 while the second, third, and fourth substrates 503, 505, 507 are still being heated. The plurality of cell structures 35 then moves upward. At T=6, the curable layer on the second substrate 503 is sufficiently cured and is removed from the second cell structure. The plurality of cell structures 35 then moves down. At T=7, the curable layer on the third substrate 505 is sufficiently cured so that it is removed from the third cell structure. The plurality of cell structures 35 then moves up again. Lastly, at T=8, the fourth substrate 507 is removed from the fourth cell structure so that all substrates are removed from the plurality of cell structures 35. In other embodiments, instead of gradually emptying all of the cell structures at T=5, 6, 7, and 8, new substrates could be inserted into the emptied cell structures at T=5, 6, 7, and 8.

The processing time for each substrate may vary according to the particular process being performed. For example, the time from T=1 to T=5 could be from about 1 to about 10 minutes for a typical curing process. Other processes may use different processing times.

Embodiments of the invention provide a number of advantages. For example, by processing substrates continuously in an apparatus according to an embodiment of the invention, processed substrates can be received by the apparatus and produced by the apparatus in more regular intervals. Substrates with uncured layers, for example, can be continuously fed to the apparatus and substrates with cured layers can be continuously removed from the apparatus. For example, in the example shown in FIG. 15, at each of T=5, 6, 7, and 8, processed substrates are removed from the heating apparatus 10 at regular intervals. At each of T=1, 2, 3, and 4, an unprocessed substrate can be loaded into the heating apparatus 10. Unprocessed substrates can be continuously fed to the heating apparatus 10 and processed substrates can be continuously retrieved from the heating apparatus 10 in embodiments of the invention.

Although many of the embodiments described herein refer to the use of gas as one way to heat the cell structures, resistive heating elements could also be used in some embodiments to heat the cell structures. For example, separate resistive elements could be used with each cell structure in some embodiments. A plurality of cell structures having one resistive heating element per cell structure can move up and down like the previously described embodiments that use gas as a heat transfer medium.

The use of gas to heat the cell structures, however, is preferred. Resistive elements require the use of electrical wires. The more electrical wires that are present in the interior of the heating apparatus, the more difficult it is to maintain near vacuum conditions inside of the heating apparatus. As noted above, it is desirable to remove oxygen from the interior of the heating apparatus in some embodiments, since oxygen is a reactive gas. Also, the gas that is used in embodiments of the invention can be use for multiple purposes. For example, the gas can be used to carry substances (e.g., water) away from the substrates being processed in addition to heating the plurality of cell structures.

II. Forming Porous Layers Using The Heating Apparatus

The apparatuses, systems, and cell structures according to embodiments of the invention may be used to practice any suitable process. Embodiments of the invention are particularly suitable for curing layers such as sol-gel layers to form porous dielectric layers. The porous dielectric layers are preferably porous oxide (silicon oxide) dielectric layers.

A typical process for forming a porous oxide layer includes depositing a sol gel precursor solution on a substrate, curing the deposited sol gel precursor solution to form a porous oxide layer, and exposing the layer to an oxidizing environment (e.g., an ozone plasma) to remove any surfactant in the layer. Processing parameters such as times, temperatures, pressures, and relative concentrations of materials may be varied by those of ordinary skill in the art.

In some embodiments, a sol gel precursor solution is formed. A typical sol gel precursor solution may include silicon and oxygen-containing compounds, water, a surfactant, and an organic solvent. For example, the sol gel precursor solution may comprise a mixture of tetraethylorthosilicate (TEOS), ethanol, water, and a surfactant. An optional acid or base catalyst may also be added to the mixture.

The silicon and oxygen containing compounds can form silica particles that are used to form silica sols. Examples of silicon and oxygen containing compounds include tetraethoxysilane (TEOS), phenyltriethyloxy silane, methyltriethoxysilane, and tetramethoxysilane (TMOS).

Surfactants can be included in the sol gel precursor solution. They are used in sol gel precursor solution to disperse, e.g., silicon and oxygen containing compounds in the solution. Surfactants can ensure that the compounds are evenly distributed in the solution and in the formed layer. In embodiments of the invention, the surfactants may be anionic, cationic, or non-ionic. Exemplary surfactants can comprise or may be derived from primary amines, polyoxyethylene oxides-propylene oxidepolyethylene oxide triblock copolymers, octaethylene glycol monodecyl ether, octaethylene glycol monohexadecyl ether, and combinations thereof.

Any suitable solvent can be used in the solution. The solvent (e.g., an organic solvent) may serve as a vehicle that facilitates the deposition of the sol gel solution on the substrate. Examples of suitable solvents include water and alcohols such as those selected from the group consisting of ethanol, n-propanol, iso-propanol, n-butanol, sec-butanol, tert-butanol, and ethylene glycol.

After the sol gel precursor solution is formed, the sol gel precursor solution is deposited on a substrate. Any suitable deposition process may be used. For example, a spin coating process or a spray-coating process can be used to deposit the sol gel precursor solution. During a typical spin coating process, centrifugal draining allows the layer to substantially cover the substrate in a thin layer of sol gel precursor solution.

After the sol gel precursor solution is deposited on a substrate, it is cured. The curing process may comprise one or more heating steps between about 50° C. and about 450° C. Any of the heating apparatus embodiments described above may be used to cure the deposited sol gel precursor solution. In some embodiments, the curing process is preferably performed for about one minute to about ten minutes. During curing, the solvent evaporates resulting in the removal of moisture in the layer. This can increase the concentration of non-volatile surfactant and silicon and oxygen containing compounds in the deposited solution. As heating continues, the silicon and oxygen compounds form particles that bind together in the thinning layer. Continued drying solidifies the forming porous layer and a microstructure may be formed in the layer. The porous layer may have a cubic phase and may be characterized as a mesoporous oxide layer in some embodiments.

After curing, the formed layer can be exposed to an oxidizing atmosphere at an elevated temperature to remove surfactant in the porous layer. In some embodiments, the temperature of the oxidizing atmosphere is preferably in the range of about 200° C. to about 400° C. The oxidizing environment preferably comprises a plasma formed from oxygen or ozone. The plasma may be present in a chamber that contains gas at a pressure of between about 0.5 Torr and about 10 Torr. In a typical embodiment, oxygen radicals bombard the layer and react with the surfactant and any remaining moisture and solvent, thereby removing them from the layer. The ion species are highly reactive and only require a short exposure of about 0.5 minutes to about 5 minutes for removal of the surfactant. As the surfactants are removed from the layer, pores continue to form and the porous layer hardens.

Alternatively or additionally, surfactant in the porous layer can be removed in a high temperature anneal process. For example, the anneal process may take place at about 400° C. to about 450° C. in some embodiments. The annealing process may also be performed at pressures ranging from near vacuum to atmospheric, and can take place for any suitable amount of time. The annealing process can take place at high pressure, e.g., greater than about 300 Torr. However, the annealing process may alternatively be performed at near vacuum pressures (e.g., about 10 Torr or less). The porous layer can be annealed in a non-reactive atmosphere comprising an inert gas. The porous layer can also be annealed when the precursor compounds comprise methyl or phenyl groups, such as in phenyltriethyloxy silane and methyltriethoxy silane. Annealing the porous layer made from methyl or phenyl containing precursor compound prevents oxidation and removal of methyl and phenyl compounds. With the retained methyl and phenyl groups, the layer has a higher carbon content, which is believed to provide for a lower dielectric constant layer.

After annealing, stripping and/or curing, a highly porous layer is formed on the substrate. The porous layer may have a porosity greater than about 50% (e.g., greater than 50% air) and may exhibit a dielectric constant of less than 2.5, preferably from about 2.2 to about 1.6. The porous layer may be a porous oxide layer and may also be characterized as a mesoporous oxide layer.

Mesoporous oxide layers are highly hydrophilic and sensitive to moisture contamination. Moisture (dielectric constant (k)>78) contamination in a mesoporous oxide layer can affect the layer's overall dielectric constant. A mesoporous oxide layer can be post-treated by silylating the porous layer and/or forming a capping layer on it.

Silylation is the process of introducing silicon into the upper surface of a deposited layer. In a chemical reaction, liquid phase or vapor phase diffusion of a reactive organosilane occurs in a reaction chamber, causing the hydrogen of hydroxyl groups present on the upper surface of the layer to be replaced with an organo-silicon group, most commonly a trimethyl silyl group. An example of such a chemical reaction is the introduction of hexamethyldisilazane (HMDS) over a dielectric layer on the substrate to form a silyl ether. The silylation process is accomplished by diffusing a silylating agent at a temperature between about 25° C. to about 200° C. This results in a hydrophobic mesoporous oxide layer. Exemplary silylating agents include tetramethyl disilazane (TMDS), hexamethyl disilazane (HMDS), and dimethylaminotrimethyl silane.

A capping layer may be deposited on the porous layer. The capping layer may comprise any material which provides a barrier from diffusion of such materials as moisture, which serves as an etch stop, or which serves as a hard mask. Examples of suitable materials are silicon dioxide, silicon nitride, silicon oxynitride, and amorphous silicon carbide. An exemplary material to use as a capping layer or other layer is an amorphous silicon carbide layer, BLOk™, which is described in U.S. patent application Ser. No. 09/165,248, entitled, "A Silicon Carbide Deposition For Use As A Barrier Layer And An Etch Stop", filed on Oct. 1, 1998. This application is assigned to the same assignee as the present application and is herein incorporated by reference in its entirety. Capping layers may be formed using any suitable CVD (chemical vapor deposition), PECVD, APCVD (atmospheric pressure chemical vapor deposition), or PVD (physical vapor deposition) process. Preferably, the capping layer is a low dielectric layer deposited using a PECVD process at a chamber pressure of about 0.5 Torr to about 10 Torr.

Once the capping layer is deposited, barrier layers, and conductive layers may be deposited on the capping layer. The processing of such layers is well known in the art. For example, suitable conductive layers may be formed using any suitable CVD, PECVD, APCVD, or PVD process. Wet processes such as electroplating and electroless plating could also be used to form conductive layers.

III. Systems Using the Heating Apparatus

The heating apparatus embodiments of the invention may be used in any suitable system used to process substrates. In some embodiments, the heating apparatus may be used as a stand-alone unit in a system in a semiconductor fabrication facility. That is, the heating apparatus may be physically detached from apparatuses that are used before or after the heating apparatus is used. In other embodiments, the heating apparatus may be physically coupled to other apparatuses that are used to process substrates before or after the heating apparatus processes substrates. For example, in some embodiments, the heating apparatus may be used in a cluster tool. The heating apparatus may be coupled to a substrate transfer chamber, and other apparatuses such as CVD apparatuses, spin or spray coating apparatuses, etc. may be coupled to the substrate transfer chamber. Each of the apparatuses in the cluster tool may be isolated from an external environment to minimize the possibility of contamination contaminating the substrates during processing.

Figure 16:
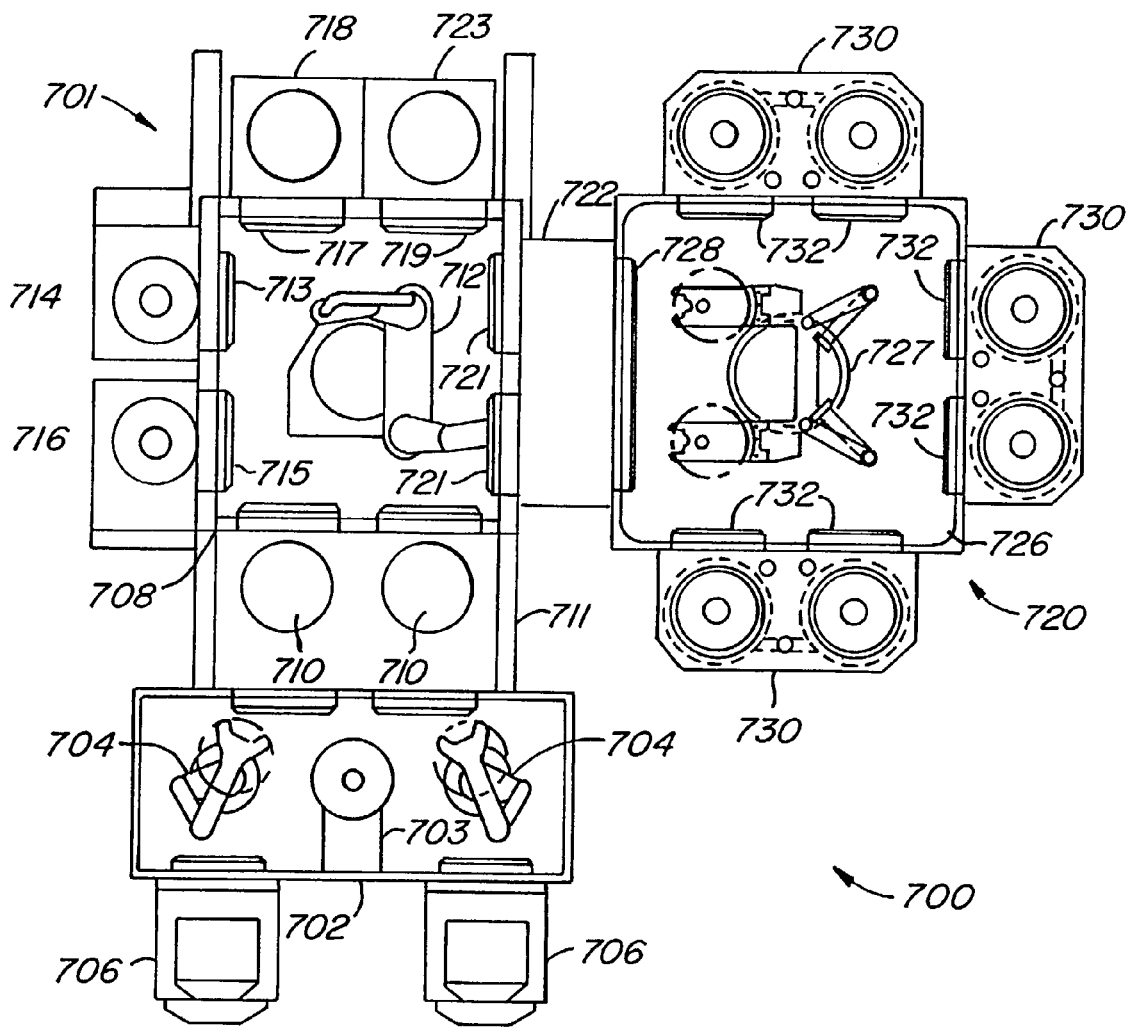
FIG. 16 shows a schematic diagram of a cluster tool according to an embodiment of the invention.

An example of a cluster tool according to an embodiment of the invention is shown in FIG. 16. FIG. 16 shows a capping layer module 720 coupled to a deposition module 701 via a substrate staging area 716. The substrate staging area 722 can include a dual stack cooling/pre-heat loadlock chamber 724. The capping layer module 720 and the deposition module 701 are coupled together to form a processing system 700 according to an embodiment of the invention. The staging area 722 may have transfer chamber doors 721, 728. Further details about exemplary systems, process modules, specific components of process modules, and methods can be found in U.S. patent application Ser. No. 09/502,126, filed Feb. 10, 2000, which is assigned to the same assignee as the present invention and is herein incorporated by reference in its entirety for all purposes.

The deposition module 701 can be used to form dielectric layers such as mesoporous oxide layers on substrates. The deposition module 701 may include one or more of a liquid deposition apparatus (e.g., a spin coating or a spray coating chamber) 714 with a slit valve 713, a heating apparatus 716 with a slit valve 715, a stripping apparatus 718 with a slit valve 717, a silylation apparatus 723 with a slit valve 719, and a cooling apparatus 711 with cooling stations 710. In some embodiments, the liquid deposition apparatus 714, the stripping apparatus 718, the silylation apparatus 723, and the cooling apparatus 711, may have two or more stacked chambers so that processing can occur in parallel in the stacked chambers.

Each of the liquid deposition apparatus 714, the heating apparatus 716, the stripping apparatus 718, the silylation apparatus 723, and the cooling apparatus 711 may be arranged around a first transfer chamber 708. A first substrate handling member 712 may be in the first transfer chamber 708. In the example shown in FIG. 16, the first substrate handling member 712 has two arms. The two arms may move independently of each other and may insert substrate into or remove substrates from the various apparatuses around the first substrate handling member 712.

The deposition module 701 may also include a front staging area 702. Two or more substrate cassettes 706 can be mounted on a staging platform (not shown) at the front of the front staging area 702. The substrate cassettes 706 can hold stacks of substrates. A substrate rest 703 may be in the front end staging area 702. The substrate rest 703 is between a pair of substrate handlers 704 in the front staging area 702. The substrate handlers 704 can insert substrates into or remove substrates from the cooling apparatus 711. Substrate handlers can be obtained from Equippe Technologies, located in Sunnyvale, Calif., as Model Nos. ATM 105 or 107.

The capping layer module 720 comprises a second transfer chamber 726 that is coupled-to the staging area 722. The second transfer chamber 726 may have transfer chamber doors 728. A second substrate handling member 727 is in the second transfer chamber 726 and may access the substrates through the doors 728. Various capping layer apparatuses 730 are disposed around the second transfer chamber 730. The interior of each capping layer apparatus 730 can be accessed through a slit 732.

In an illustrative example of how the system 700 can be used, the substrate handlers 704 obtains substrates from the substrate cassettes 706 and transfers them to the cooling stations 710 in cooling apparatus 711. The first substrate handling member 712 retrieves one or both of the substrates from the cooling stations 710 and then transfers the substrates to the liquid deposition apparatus 714. In the liquid deposition apparatus 714, a sol gel precursor solution is deposited on the substrates.

Once the sol gel precursor layers are formed on the substrates, the first substrate handling member 712 retrieves the substrates and then transfers the substrate to the heating apparatus 716. After receiving the substrates, the plurality of cell structures in the heating apparatus 716 can move (e.g., vertically) as described above. Cell structures with processed substrates can be aligned with the slit 715 so that the first substrate handling member 712 can retrieve substrates with cured layers on them. The cell structures with substrates having cured sol get layers on them can be aligned with the slit 715 so that the first substrate handling member 712 can access them. After the substrates with cured layers are retrieved by the first substrate handling member 712, the substrates are transferred to the substrate stripping apparatus 718. In the stripping apparatus 718, surfactant in the cured sol gel layers is removed. An annealing apparatus could be used in addition to or as an alternative to the stripping apparatus.

If the cured and stripped layers on the substrates are to be silylated, the substrates are retrieved from the stripping apparatus 718 and are transferred to the silylation apparatus 723. In the silylation apparatus 723, the porous dielectric layers on the substrates are silylated.

Capping layers can then be deposited on the porous dielectric layers on the substrates. The second substrate handling member 727 can retrieve the substrates via the staging area 722. The substrates can be inserted into the various capping layer apparatuses 730 through slits 732. In the capping layer apparatuses 730, capping layers can be formed on the porous dielectric layers. Examples of suitable capping layer apparatuses include, but are not limited to, CVD, PECVD, APCVD, and PVD apparatuses.

Other system embodiments may have fewer or more apparatuses. For example, a suitable system may be a cluster tool that includes only the deposition module 701 without the capping layer module 720. In another alternative embodiment, the front staging area 702 could be omitted.

While the foregoing is directed to certain preferred embodiments of the present invention, other and further embodiments of the invention may be devised without departing from the basic scope of the invention. Such alternative embodiments are intended to be included within the scope of the present invention.

Moreover, the features of one or more embodiments of the invention may be combined with one or more features of other embodiments of the invention without departing from the scope of the invention. For example, in FIGS. 14 and 15, methods including general descriptions of heating apparatuses are provided to illustrate some method embodiments. FIG. 16 includes a general description of a system according to an embodiment of the invention. It is understood that any of the features discussed in FIGS. 1 to 13 can be used in any suitable combination with the methods discussed with reference to FIGS. 14 and 15, as well as the system described with reference to FIG. 16.

What is claimed is:

1. An apparatus for processing substrates, the apparatus comprising:
   a) a housing;
   b) an opening in the housing;
   c) a plurality of stacked cell structures within the housing, wherein each cell structure within the plurality of stacked cells is capable of containing a substrate, and wherein gas passages extend vertically through the plurality of cell structures;
   d) a heating assembly coupled to the plurality of stacked cell structures; and
   e) an actuator adapted to move the plurality of stacked cell structures inside of the housing.

2. The apparatus of claim 1 wherein the opening is at a fixed position in the housing and wherein the actuator is a linear actuator adapted to move the plurality of cell structures up and down inside of the housing so that substrates can be inserted into the cells in the plurality of cells through the opening.

3. The apparatus of claim 1 wherein the plurality of stacked cell structures includes at least three cell structures.

4. The apparatus of claim 1 wherein the heating assembly is between the plurality of cell structures and the actuator.

5. The apparatus of claim 1 wherein the heating assembly is a first heating assembly and wherein the apparatus further comprises a second heating assembly adapted to heat the housing.

6. The apparatus of claim 1 wherein the housing is a first housing and wherein the apparatus comprises a second housing that is outside of the first housing.

7. The apparatus of claim 1 wherein the apparatus is a curing apparatus.

8. A system for processing substrates, the system comprising:
a first semiconductor process apparatus including the heating apparatus according to claim 1; and
a second semiconductor process apparatus coupled to the first semiconductor process apparatus.

9. The system of claim 8 wherein the system is a cluster tool.

10. An apparatus for processing substrates, the apparatus comprising:
a) a housing;
b) an opening in the housing;
c) a plurality of stacked cell structures within the housing, wherein each cell structure within the plurality of stacked cells is capable of containing a substrate;
d) a heating assembly coupled to the plurality of stacked cell structures; and
e) an actuator adapted to move the plurality of stacked cell structures inside of the housing, wherein each cell structure in the plurality of cell structures comprises:
a first gas permeable element under the substrate in the cell structure, and
a second gas permeable element above the substrate in the cell structure.

11. The apparatus of claim 10 wherein the first gas permeable element comprises a tray and the second gas permeable element comprises a plate.

12. An apparatus for processing substrates, the apparatus comprising:
a) a housing;
b) an opening in the housing;
c) a plurality of stacked cell structures within the housing, wherein each cell structure within the plurality of stacked cells is capable of containing a substrate;
d) a heating assembly coupled to the plurality of stacked cell structures; and
e) an actuator adapted to move the plurality of stacked cell structures inside of the housing, wherein each cell structure comprises
a first gas permeable element, and
a second gas permeable element facing the first permeable gas element, and
a plurality of support pins extending from the first gas permeable element.

13. An apparatus for processing substrates, the apparatus comprising:
a) a housing;
b) an opening in the housing;
c) a plurality of stacked cell structures within the housing, wherein each cell structure within the plurality of stacked cells is capable of containing a substrate;
d) a heating assembly coupled to the plurality of stacked cell structures; and
e) an actuator adapted to move the plurality of stacked cell structures inside of the housing, and wherein the apparatus further comprises
an exhaust tube coupled to the plurality of cell structures; and
a cold trap downstream of the exhaust tube.

14. A system for processing substrates, the system comprising:
a first semiconductor process apparatus including the heating apparatus comprising a) a housing, b) an opening in the housing, c) a plurality of stacked cell structures within the housing, wherein each cell structure within the plurality of stacked cells is capable of containing a substrate, d) a heating assembly coupled to the plurality of stacked cell structures; and e) an actuator adapted to move the plurality of stacked cell structures inside of the housing; and
a second semiconductor process apparatus coupled to the first semiconductor process apparatus
wherein the second semiconductor process apparatus comprises a liquid deposition apparatus, and wherein the system further comprises a third semiconductor process apparatus comprising a vapor deposition apparatus.

15. The system of claim 14 wherein the vapor deposition apparatus is a chemical vapor deposition apparatus.

16. An apparatus for heating substrates, the apparatus comprising:
a) a first housing having a first opening;
b) a second housing around the first housing and having a second opening, wherein the first opening and the second opening are aligned to form an entrance;
c) a plurality of stacked cell structures within the housing, wherein each cell structure is capable of containing a substrate and defines a cell, and wherein each cell structure comprises a first gas permeable element, a second gas permeable plate facing the first permeable gas element, and a plurality of pins extending from the first permeable element;
d) a linear actuator adapted to move the plurality of stacked cell structures in a vertical direction;
e) a feed gas tube coupled to the plurality of stacked cell structures;
f) an exhaust tube coupled to the plurality of stacked cell structures;
g) a cold trap coupled to the exhaust tube, wherein the exhaust tube is between the plurality of stacked cell structures and the cold trap;
h) a first heating assembly coupled to the plurality of stacked cell structures, wherein the first heating assembly is adapted to heat gas passing upstream and downstream of the plurality of cell structures; and
i) a second heating assembly adapted to heat the first housing.

17. The apparatus of claim 16 wherein the first gas permeable element is a gas permeable tray with a rim and the second gas permeable element is a gas permeable plate.

18. The apparatus of claim 16 wherein the plurality of stacked cell structures comprises at least three cell structures.

19. The apparatus of claim 16 wherein the apparatus is a curing apparatus.

20. The apparatus of claim 16 wherein the gas permeable tray includes channels at a bottom surface of the gas permeable tray.

21. An apparatus for processing substrates, the apparatus comprising:
a) a housing;
b) an opening in the housing;
c) a plurality of stacked cell structures within the housing, wherein each cell structure within the plurality of stacked cells is capable of containing a substrate;

d) a feed gas tube coupled to the plurality of stacked cell structures;

e) a heating assembly adapted to supply heat to the substrate; and f) an actuator adapted to move the plurality of stacked cell structures inside of the housing.

22. The apparatus of claim 21 wherein the heating assembly supplies heat to the substrate through the housing.

23. The apparatus of claim 21 wherein the heating assembly is heated by using a heating fluid.

24. The apparatus of claim 21 wherein the heating assembly comprises a resistive heating element.

25. An apparatus for processing substrates, the apparatus comprising:

a) a housing;

b) a plurality of stacked cell structures within the housing, wherein each cell structure within the plurality of stacked cells comprises a first gas permeable element and a second gas permeable element facing the first gas permeable element;

c) a heating assembly adapted to supply heat to the substrate; and d) an actuator adapted to move the plurality of stacked cell structures inside of the housing.

26. The apparatus of claim 25 wherein the cell structure further comprises a plurality of pins that extend from the first gas permeable element.

27. The apparatus of claim 25 wherein the first gas permeable element is in the form of a tray.

28. An apparatus for processing substrates, the apparatus comprising:

a) a housing;

b) an opening in the housing;

c) a plurality of stacked cell structures within the housing, wherein each cell structure within the plurality of stacked cells is capable of containing a substrate;

d) a heating assembly adapted to supply heat to the substrate; and e) an actuator adapted to move the plurality of stacked cell structures inside of the housing, wherein each cell structure contains a first gas permeable element and a second gas permeable element, and wherein the substrate is between the first and second gas permeable elements when the substrate is being heated.

29. The apparatus of claim 28 wherein the first gas permeable element is in the form of a tray.

30. The apparatus of claim 29 wherein the first gas permeable element has channels for a heating gas.

31. The apparatus of claim 30 wherein the second gas permeable element is in the form of a disk.

32. The apparatus of claim 31 wherein the first and second gas permeable elements comprise stainless steel.

33. The apparatus of claim 32 wherein the heating gas is an inert gas.

* * * * *

UNITED STATES PATENT AND TRADEMARK OFFICE
CERTIFICATE OF CORRECTION

PATENT NO.       : 7,431,585 B2                                        Page 1 of 1
APPLICATION NO.  : 10/278615
DATED            : October 7, 2008
INVENTOR(S)      : Zhao et al.

It is certified that error appears in the above-identified patent and that said Letters Patent is hereby corrected as shown below:

Column 3, line 57, delete "pas", and insert --gas--;

Column 3, line 65, delete "tim eT=0", and insert --time T=0--.

Signed and Sealed this

Twentieth Day of January, 2009

JON W. DUDAS
*Director of the United States Patent and Trademark Office*